US012725661B2

(12) United States Patent
Zhou

(10) Patent No.: US 12,725,661 B2
(45) Date of Patent: Sep. 1, 2026

(54) MEMORY SYSTEMS AND METHODS OF CONTROLLING THE SAME, AND READABLE STORAGE MEDIA

(71) Applicant: YANGTZE MEMORY TECHNOLOGIES CO., LTD., Wuhan (CN)

(72) Inventor: Teng Zhou, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 93 days.

(21) Appl. No.: 18/816,825

(22) Filed: Aug. 27, 2024

(65) Prior Publication Data

US 2025/0299750 A1 Sep. 25, 2025

(30) Foreign Application Priority Data

Mar. 25, 2024 (CN) ......................... 202410345772.2

(51) Int. Cl.

*G11C 16/04* (2006.01)
*G06F 12/02* (2006.01)
*G11C 11/56* (2006.01)
*G11C 16/26* (2006.01)
*G11C 16/34* (2006.01)

(52) U.S. Cl.

CPC ...... *G11C 16/3404* (2013.01); *G06F 12/0246* (2013.01); *G11C 11/5642* (2013.01); *G11C 11/5671* (2013.01); *G11C 16/0483* (2013.01); *G11C 16/26* (2013.01)

(58) Field of Classification Search

CPC ............ G11C 16/3404; G11C 11/5642; G11C 11/5671; G11C 16/0483; G11C 16/26; G11C 16/30; G06F 12/0246

See application file for complete search history.

(56) References Cited

U.S. PATENT DOCUMENTS 10,446,241 B1 * 10/2019 Liikanen ................ G11C 16/26

* cited by examiner

*Primary Examiner* — Xiaochun L Chen
(74) *Attorney, Agent, or Firm* — Conley Rose, P.C.

(57) ABSTRACT

An example memory system includes a memory device and a memory controller. The memory device includes memory cells each configured to be in one of data states. The memory controller is configured to: perform a read operation using a test read voltage corresponding to a selected data state among the data states; acquire a count of memory cells each having a threshold voltage that satisfies a preset condition including: the threshold voltage being less than or equal to the test read voltage, or the threshold voltage being greater than or equal to the test read voltage; determine a difference between the count and an expected count; and acquire at least one read retry voltage according to the difference, a mapping relationship, and a read retry table, wherein the mapping relationship includes a correspondence between an expected voltage offset value and the difference.

20 Claims, 19 Drawing Sheets

| RRT(READ RETRY TABLE) | | | | | | | |
|---|---|---|---|---|---|---|---|
| OPTIONS/ INDEX | RD1 | RD2 | RD3 | RD4 | RD5 | RD6 | RD7 |
| RR-1 | V1 | --- | --- | --- | --- | --- | --- |
| RR-2 | --- | --- | --- | --- | --- | --- | --- |
| RR-3 | --- | --- | --- | --- | --- | --- | --- |
| ...... | ...... | ...... | ...... | ...... | ...... | ...... | ...... |
| RR-M | --- | --- | --- | --- | --- | --- | --- |

FIG. 8

| NEW INDEX | ORIGINAL INDEX | RD3 | RD7 |
|---|---|---|---|
| 3 | RR-27 | -50 | -300 |
| 4 | RR-33 | -100 | -300 |
| 5 | RR-26 | -50 | -270 |
| 6 | RR-25 | -50 | -250 |
| 7 | RR-32 | -80 | -250 |
| 8 | RR-24 | -30 | -200 |
| 9 | RR-31 | -80 | -200 |

FIG. 16

MEMORY SYSTEMS AND METHODS OF CONTROLLING THE SAME, AND READABLE STORAGE MEDIA

CROSS-REFERENCE TO RELATED APPLICATIONS

The present application claims priority to Chinese Patent Application No. 2024103457722, which was filed Mar. 25, 2024, is titled "MEMORY SYSTEMS AND THEIR CONTROLLING METHODS, READABLE STORAGE MEDIA," and is hereby incorporated herein by reference in its entirety.

TECHNICAL FIELD

Examples of the present disclosure relate to the technical field of semiconductor technology, and in examples to a memory system and a control method thereof, and a readable storage medium.

BACKGROUND

A memory is a storage apparatus configured to store information in the modern information technology. As a typical non-volatile semiconductor memory, the Not-And (NAND) type memory has become a mainstream product in the memory market due to a high storage density, controllable production costs, appropriate programming and erasing speeds, and a retention characteristic.

SUMMARY

According to some aspects of examples of the present disclosure, there is provided a memory system comprising: a memory device comprising a plurality of memory cells, wherein each of the plurality of memory cells is configured to be in one of a plurality of data states; and a memory controller coupled with the memory device and configured to: perform a read operation using a test read voltage corresponding to a selected data state among the plurality of data states; acquire a count of memory cells each having a threshold voltage that satisfies a preset condition, wherein the preset condition comprises: the threshold voltage being less than or equal to the test read voltage, or the threshold voltage being greater than or equal to the test read voltage; determine a difference between the count and an expected count; and acquire at least one read retry voltage according to the difference, a mapping relationship, and a read retry table, wherein the mapping relationship comprises a correspondence between an expected voltage offset value and the difference.

In some examples, the count comprises a first count of memory cells each having a threshold voltage less than or equal to the test read voltage among the plurality of memory cells, the expected count comprises a first expected count, which is a preset count of memory cells each having a threshold voltage less than or equal to a default read voltage among the plurality of memory cells, the mapping relationship comprises a first mapping relationship, which is acquired based on the first expected count, and the memory controller is further configured to: acquire a first expected voltage offset value according to a first difference between the first count and the first expected count, the first mapping relationship, and a voltage difference between the test read voltage and the default read voltage; and acquire at least one first voltage offset value from the read retry table according to the first expected voltage offset value.

In some examples, the at least one first voltage offset value is stored in the read retry table in order of magnitude.

In some examples, the at least one first voltage offset value comprises one or more first voltage offset values equal to the first expected voltage offset value.

In some examples, the memory controller is further configured to: generate an offset value range according to the first expected voltage offset value, wherein the first expected voltage offset value is within the offset value range; and acquire the at least one first voltage offset value located within the offset value range from the read retry table.

In some examples, the maximum value of the offset value range is the first expected voltage offset value plus a first step length, and the minimum value of the offset value range is the first expected voltage offset value minus a second step length.

In some examples, the memory controller is further configured to: acquire a plurality of adjacent first voltage offset values from the read retry table.

In some examples, the memory cells are multi-bit memory cells, and the plurality of data states are distinguished from each other by multi-level read voltages, and the read retry table is configured to store second voltage offset values corresponding to at least one level of read voltage, wherein the second voltage offset values corresponding to the highest level of read voltage are stored in order of magnitude, and the at least one first voltage offset value is included in the second voltage offset values corresponding to the highest level of read voltage.

In some examples, the multi-level read voltages are divided into a plurality of groups, the read retry table comprises a plurality of read retry sub-tables, wherein one of the read retry sub-tables is configured to store the second voltage offset values corresponding to at least one level of read voltage in one of the groups, the second voltage offset values corresponding to the highest level of read voltage are stored in the read retry sub-table in order of magnitude, and the at least one first voltage offset value is included in the second voltage offset values corresponding to the highest level of read voltage in the read retry sub-table.

In some examples, the first count of memory cells each having a threshold voltage less than the test read voltage among the plurality of memory cells is greater than a second count of memory cells each having a threshold voltage greater than the test read voltage among the plurality of memory cells.

In some examples, the memory controller is configured to: sum the default read voltage and each of the first voltage offset values to obtain the corresponding read retry voltage.

According to some aspects of examples of the present disclosure, there is provided control method of a memory system, comprising: performing a read operation on a plurality of memory cells using a test read voltage corresponding to a selected data state among a plurality of data states, wherein each of the plurality of memory cells is configured to be in one of the plurality of data states; acquiring a count of memory cells each having a threshold voltage that satisfies a preset condition, wherein the preset condition comprises: the threshold voltage being less than or equal to the test read voltage, or the threshold voltage being greater than or equal to the test read voltage; determining a difference between the count and an expected count; and acquiring at least one read retry voltage according to the difference, a mapping relationship, and a read retry table, wherein the mapping relationship comprises a correspondence between an expected voltage offset value and the difference.

In some examples, the count comprises a first count of memory cells each having a threshold voltage less than or equal to the test read voltage among the plurality of memory cells, the expected count comprises a first expected count, which is a preset count of memory cells each having a threshold voltage less than or equal to a default read voltage among the plurality of memory cells, the mapping relationship comprises a first mapping relationship, which is acquired based on the first expected count, and the control method further comprises:

- acquiring a first expected voltage offset value according to a first difference between the first count and the first expected count, the first mapping relationship, and a voltage difference between the test read voltage and the default read voltage; and
- acquiring at least one first voltage offset value from the read retry table according to the first expected voltage offset value.

In some examples, the at least one first voltage offset value is stored in the read retry table in order of magnitude.

In some examples, the at least one first voltage offset value comprises one or more first voltage offset values equal to the first expected voltage offset value.

In some examples, the control method further comprises: generating an offset value range according to the first expected voltage offset value, wherein the first expected voltage offset value is within the offset value range; and acquiring the at least one first voltage offset value located within the offset value range from the read retry table.

In some examples, the maximum value of the offset value range is the first expected voltage offset value plus a first step length, and the minimum value of the offset value range is the first expected voltage offset value minus a second step length.

In some examples, the control method further comprises: acquiring a plurality of adjacent first voltage offset values from the read retry table.

In some examples, the memory cells are multi-bit memory cells, and the plurality of data states are distinguished from each other by multi-level read voltages, and the read retry table is configured to store second voltage offset values corresponding to at least one level of read voltage, wherein the second voltage offset values corresponding to the highest level of read voltage are stored in order of magnitude, and the at least one first voltage offset value is included in the second voltage offset values corresponding to the highest level of read voltage.

In some examples, the multi-level read voltages are divided into a plurality of groups, the read retry table comprises a plurality of read retry sub-tables, wherein one of the read retry sub-tables is configured to store the second voltage offset values corresponding to at least one level of read voltage in one of the groups, the second voltage offset values corresponding to the highest level of read voltage are stored in the read retry sub-table in order of magnitude, and the at least one first voltage offset value is included in the second voltage offset values corresponding to the highest level of read voltage in the read retry sub-table.

In some examples, the first count of memory cells each having a threshold voltage less than the test read voltage among the plurality of memory cells is greater than a second count of memory cells each having a threshold voltage greater than the test read voltage among the plurality of memory cells.

In some examples, the control method further comprises: summing the default read voltage and each of the first voltage offset values to obtain the corresponding read retry voltage.

According to some aspects of examples of the present disclosure, there is provided a readable storage medium storing a computer program which, when executed, implements the control method.

BRIEF DESCRIPTION OF THE DRAWINGS

FIG. 8 is a schematic diagram illustrating an example read retry table according to examples of the present disclosure;

FIG. 16 is a schematic diagram illustrating another example read retry table according to examples of the present disclosure;

DETAILED DESCRIPTION

Figure 1:
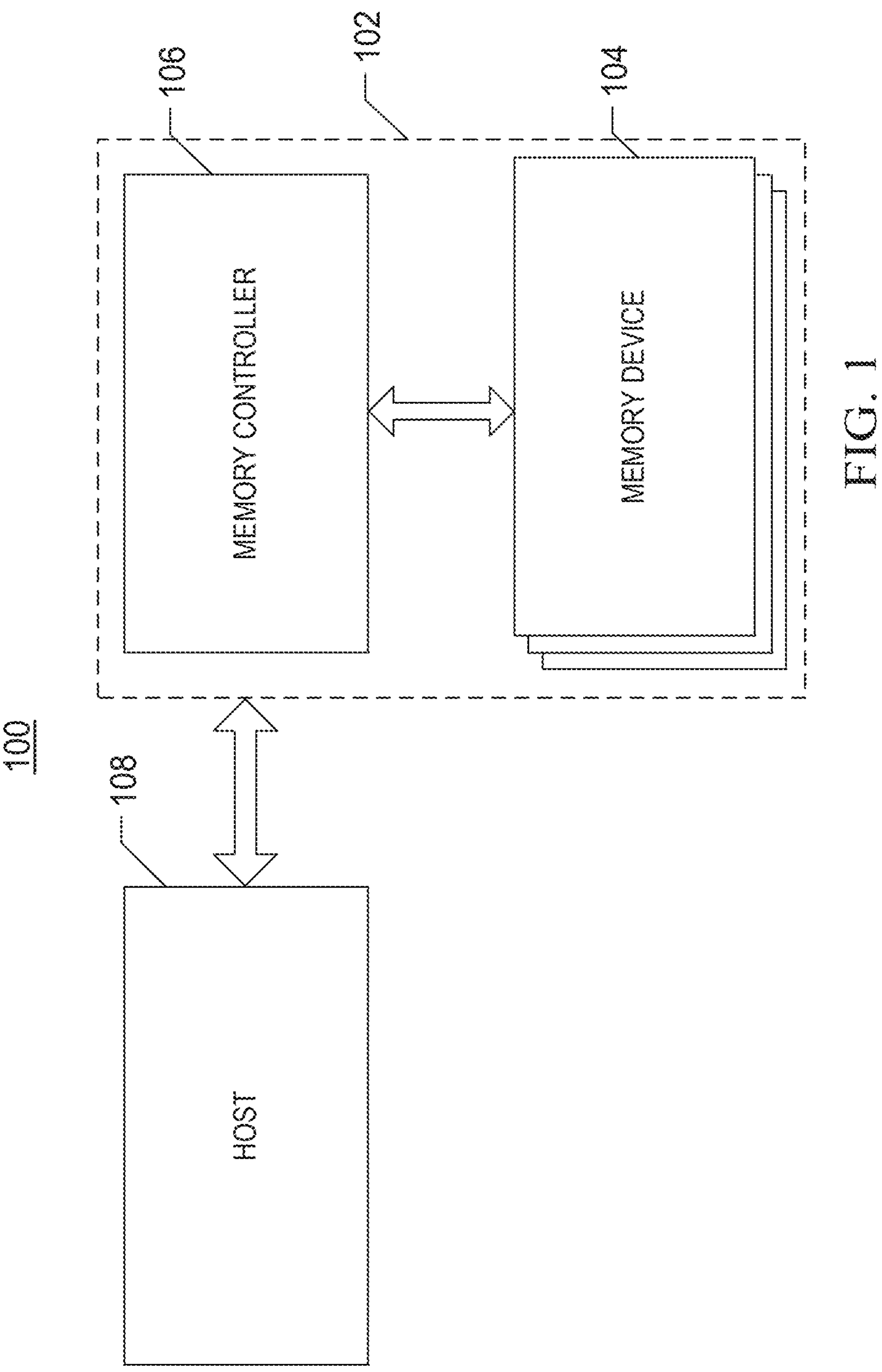
FIG. 1 is a schematic diagram illustrating an example system according to examples of the present disclosure.

Examples disclosed in the present disclosure will be described in more detail below with reference to the accompanying drawings. Although examples of the present disclosure are shown in the drawings, it should be understood that the present disclosure may be implemented in various ways and should not be limited to the DETAILED DESCRIPTION set forth herein. Rather, these examples are provided so that the present disclosure can be more thoroughly understood and the scope of the present disclosure can be fully conveyed to those skilled in the art.

In the following description, numerous specific details are given in order to provide a more thorough understanding of the present disclosure. It will be apparent, however, to one skilled in the art that the present disclosure may be practiced without one or more of these details. In other examples, some technical features well-known in the art are not described to avoid confusion with the present disclosure; that is, not all features of the actual example are described here, and well-known functions and structures are not described in detail.

It will be understood that when an element or layer is referred to as being "on," "adjacent to," "connected to" or "coupled to" other elements or layers, it can be directly on, adjacent to, connected to, or coupled to other elements or layers, or intervening elements or layers may be present. In contrast, when an element is referred to as being "directly on," "directly adjacent to," "directly connected to" or "directly coupled to" other elements or layers, there are no intervening elements or layers. As used herein, "a", "an" and "said/the" in singular forms are intended to include the plural forms as well, unless the context clearly dictates otherwise. It should also be understood that at least one of the terms "consists of" or "comprising", when used in this specification, identify the presence of at least one of stated features, integers, operations, elements or components, but do not exclude presence or addition of at least one of one or more other features, integers, operations, elements, components or groups. As used herein, the term "at least one of . . . " includes any and all combinations of the associated listed items.

It should be understood that, references to "one example" or "an example" throughout this specification mean that particular features, structures, or characteristics related to the example are comprised in at least one example of the present disclosure. Therefore, "in one example" or "in an example" presented throughout this specification does not necessarily refer to the same example. Furthermore, these particular features, structures, or characteristics may be incorporated in one or more examples in any suitable manner. It is to be understood that, in various examples of the present disclosure, sequence numbers of the above processes do not indicate an execution order, and an execution order of various processes shall be determined by functionalities and intrinsic logics thereof, and shall constitute no limitation on an implementation process of the examples of the present disclosure. The above sequence numbers of the examples of the present disclosure are only for description, and do not represent advantages or disadvantages of the examples. The methods disclosed in the several method examples provided in the present disclosure can be arbitrarily combined without conflict to obtain new method examples.

The memory device in the examples of the present disclosure includes but is not limited to a three-dimensional NAND type memory, and for ease of understanding, a three-dimensional NAND type memory is used as an example for illustration.

FIG. 1 illustrates a block diagram of an example system 100 having a memory device, according to some aspects of the present disclosure. System 100 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 1, system 100 can include a host 108 and a memory system 102 having one or more memory devices 104 and a memory controller 106. The host 108 can be a processor of an electronic device, such as a central processing unit (CPU), or a system-on-chip (SoC), such as an application processor (AP). The host 108 can be configured to send or receive data to or from the memory device 104.

The memory controller 106 is coupled to the memory device 104 and the host 108 and is configured to control the memory device 104, according to some examples. The memory controller 106 can manage the data stored in the memory device 104 and communicate with the host 108. In some examples, the memory controller 106 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some examples, the memory controller 106 is designed for operating in a high duty-cycle environment SSD or embedded multi-media-cards (eMMCs) used as data storage for mobile devices, such as smartphones, tablets, laptop computers, etc., and enterprise storage arrays.

The memory controller 106 can be configured to control operations of the memory device 104, such as read, erase, and program operations. The memory controller 106 can also be configured to manage various functions with respect to the data stored or to be stored in the memory device 104 including, but not limited to bad-block management, garbage collection, logical-to-physical address conversion, wear leveling, etc. In some examples, the memory controller 106 is further configured to process error correction codes (ECC) with respect to the data read from or written to the memory device 104. Any other suitable functions may be performed by the memory controller 106 as well, for example, formatting the memory device 104. The memory controller 106 can communicate with an external device (e.g., the host 108) according to a particular communication protocol. For example, the memory controller 106 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 2B:
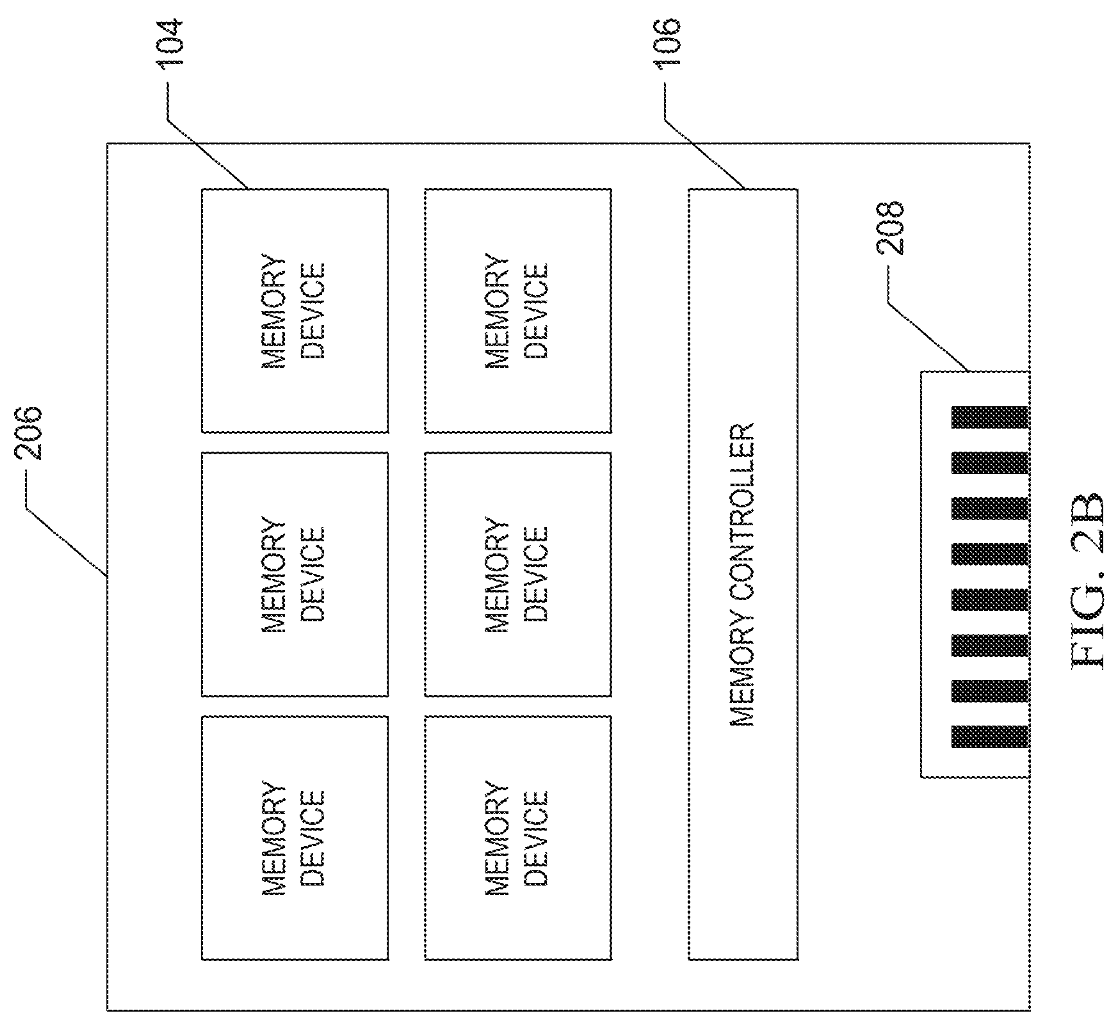
FIG. 2B is a schematic diagram illustrating an example solid state drive according to examples of the present disclosure.
Figure 2A:
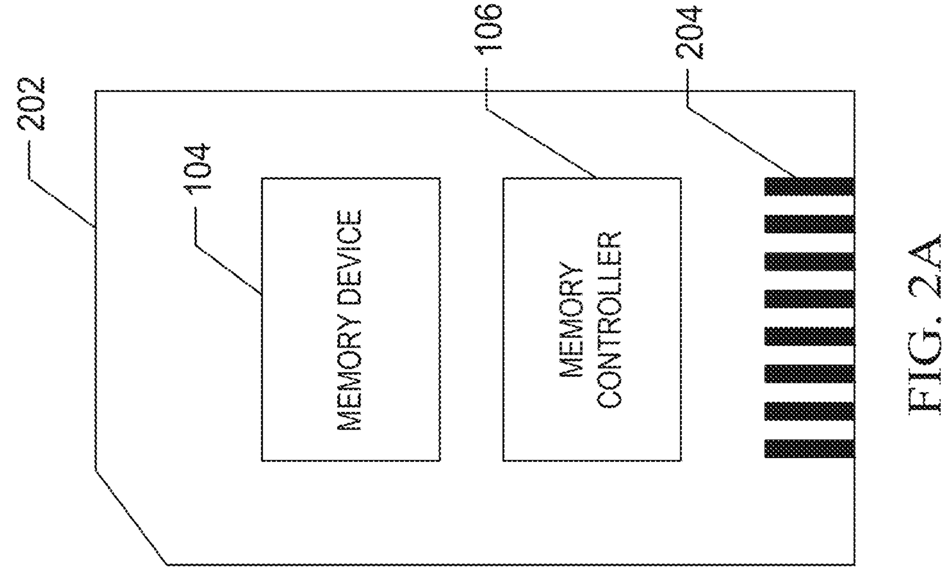
FIG. 2A is a schematic diagram illustrating an example memory card according to examples of the present disclosure.

The memory controller 106 and one or more memory devices 104 can be integrated into various types of storage devices, for example, be included in the same package, such as a universal Flash storage (UFS) package or an eMMC package. That is, the memory system 102 can be implemented and packaged into different types of end electronic products. In one example as shown in FIG. 2A, the memory controller 106 and a single memory device 104 may be integrated into a memory card 202. The memory card 202 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. The memory card 202 can further include a memory card connector 204 coupling the memory card 202 with a host (e.g., the host 108 in FIG. 1). In another example as shown in FIG. 2B, the memory controller 106 and multiple memory devices 104 may be integrated into an SSD 206. The SSD 206 can further include an SSD connector 208 coupling the SSD 206 with a host (e.g., the host 108 in FIG. 1). In some examples, at least one of the storage capacity or the operation speed of the SSD 206 is greater than those of the memory card 202.

Figure 3:
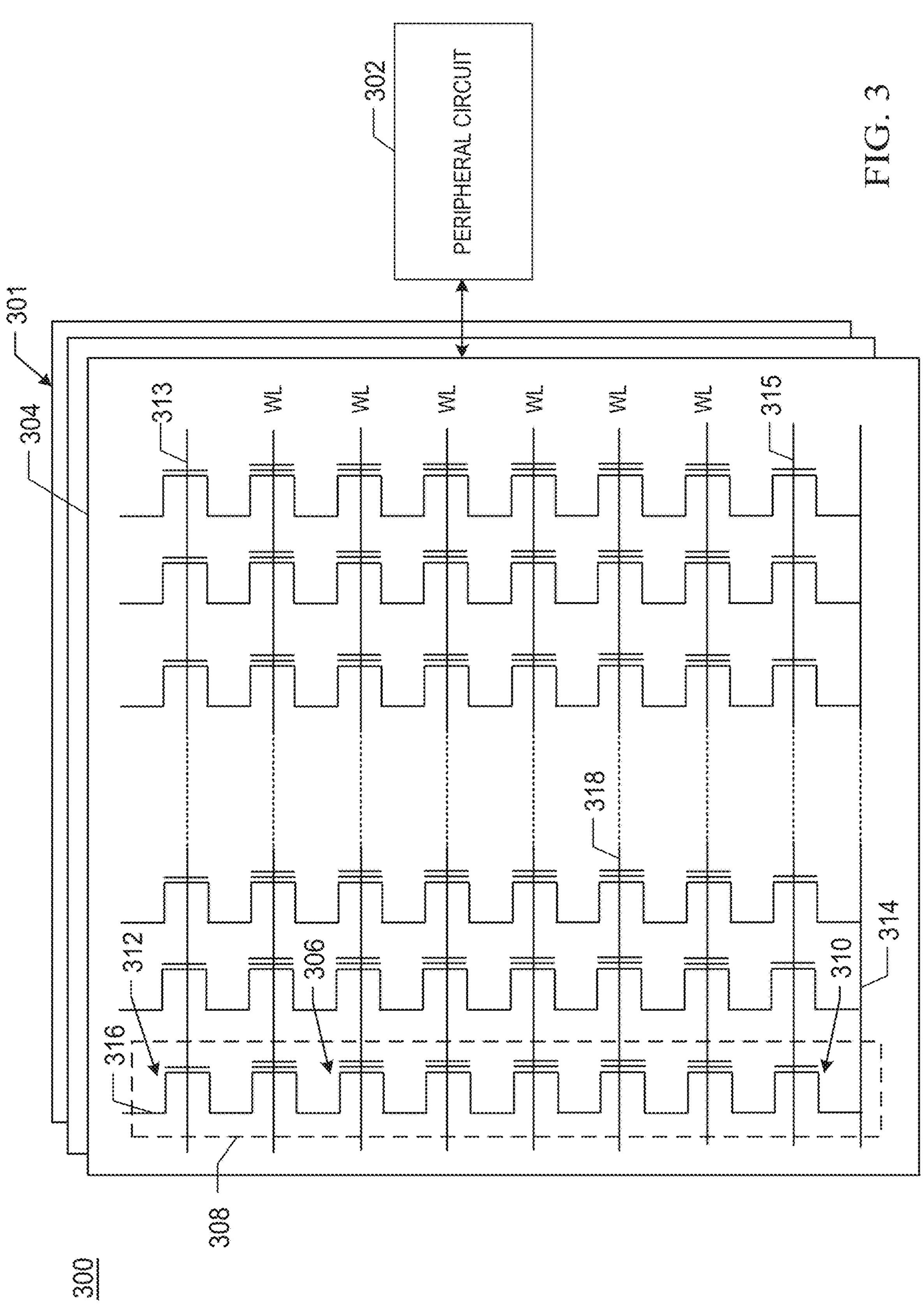
FIG. 3 is a schematic diagram illustrating an example memory device according to examples of the present disclosure.

FIG. 3 illustrates a schematic circuit diagram of an example memory device 300 including a peripheral circuit, according to some aspects of the present disclosure. The memory device 300 can be an example of the memory device 104 in FIG. 1. The memory device 300 can include a memory cell array 301 and a peripheral circuit 302 coupled to the memory cell array 301. The memory cell array 301 is illustrated as an example of a three-dimensional NAND type memory cell array, in which memory cells 306 are provided in the form of an array of NAND memory strings 308 each extending vertically above a substrate (not shown). In some examples, each NAND memory string 308 includes a plurality of memory cells 306 coupled in series and stacked vertically. Each memory cell 306 can hold a continuous, analog value, such as an electrical voltage or charge, that depends on the number of electrons trapped within a region of the memory cells 306. Each memory cell 306 can be either a floating gate type of memory cell including a floating-gate transistor or a charge trap type of memory cell including a charge-trap transistor.

In some examples, each memory cell 306 is a single-level cell (SLC) that has two possible memory states and thus, can store one bit of data. For example, the first memory state "0" can correspond to a first range of voltages, and the second memory state "1" can correspond to a second range of voltages. In some examples, each memory cell 306 is a multi-level cell (MLC) that is capable of storing more than a single bit of data in more than four memory states. For example, the MLC can store two bits per cell, three bits per cell (also known as Trinary-Level cell (TLC)), or four bits per cell (also known as a Quad-Level cell (QLC)). Each MLC can be programmed to assume a range of possible nominal storage values. In one example, if each MLC stores two bits of data, then the MLC can be programmed to write one of three possible nominal storage values to the cell, and a fourth nominal storage value except for the three nominal storage values can be used to indicate the erased state.

As shown in FIG. 3, each NAND memory string 308 can include a bottom selective gate (BSG) 310 at its source end and a top selective gate (TSG) 312 at its drain end. BSG 310 and TSG 312 can be configured to activate selected NAND memory strings 308 during read and program operations. In some examples, the sources of NAND memory strings 308 in the same memory block 304 are coupled through the same source line (SL) 314, e.g., a common SL. For example, all NAND memory strings 308 in the same memory block 304 have an array common source (ACS), according to some examples. TSG 312 of each NAND memory string 308 is coupled to a respective bit line (BL) 316 from which data can be read or written via an output bus (not shown), according to some examples. In some examples, each NAND memory string 308 is configured to be selected or deselected by at least one of: applying a select voltage (e.g., above the threshold voltage of the transistor having TSG 312) or a deselect voltage (e.g., 0 V) to respective TSG 312 through one or more TSG lines 313 or applying a select voltage (e.g., above the threshold voltage of the transistor having BSG 310) or a deselect voltage (e.g., 0 V) to respective BSG 310 through one or more BSG lines 315.

Figure 4:
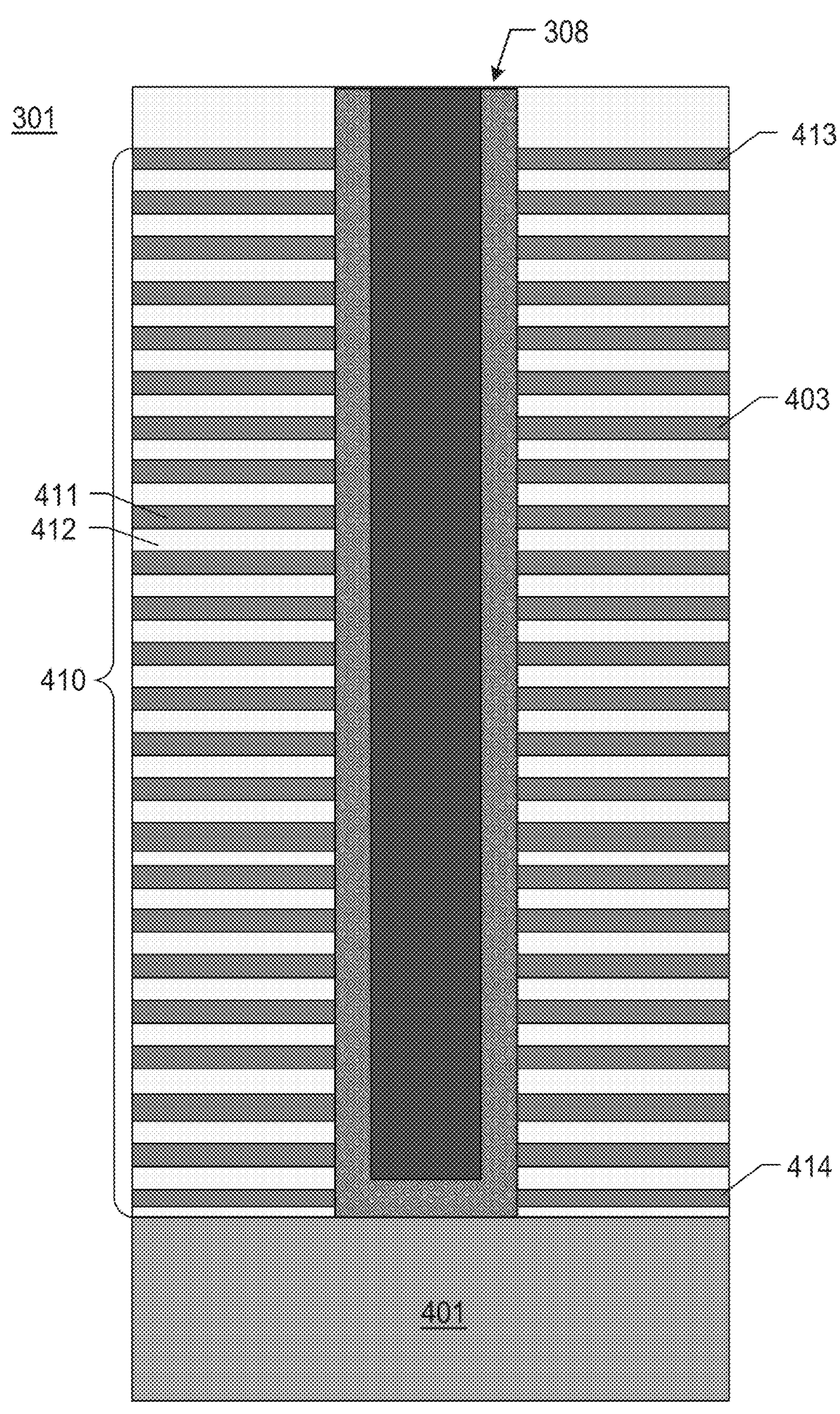
FIG. 4 is a schematic diagram illustrating an example cross section of a memory cell array according to examples of the present disclosure.

As shown in FIG. 3, the NAND memory strings 308 can be organized into multiple memory blocks 304, each of which can have a common source line 314, e.g., coupled to the ground. In some examples, each memory block 304 is the basic data unit for erase operations, e.g., all memory cells 306 on the same memory block 304 are erased at the same time. To erase memory cells 306 in a selected memory block **304*a*, source lines 314 coupled to the selected memory block 304*a* as well as unselected memory blocks 304*b* in the same plane as the selected memory block 304*a* can be biased with an erase voltage (Vers), such as a high positive voltage (e.g., 20 V or more). It is understood that in some examples, the erase operation may be performed at a half-memory block level, a quarter-memory block level, or a level having any suitable number of memory blocks or any suitable fractions of a memory block. Memory cells 306 of adjacent NAND memory strings 308 can be coupled through word lines 318 that select which row of memory cells 306 is affected by read and program operations. FIG. 4 shows a schematic cross-sectional view of an example memory cell array 301 including NAND memory strings 308 in accordance with aspects of the present disclosure. As shown in FIG. 4, the NAND memory cell array 301 may include a stacked structure 410, which includes a plurality of gate layers 411 and a plurality of insulating layers 412 alternately stacked in sequence, and a memory string penetrating vertically through the gate layers 411 and the insulating layers 412. The gate layer 411 and the insulating layer 412 can be stacked alternately, and two adjacent gate layers 411 are separated by an insulating layer 412. The number of pairs of gate layers 411 and insulating layers 412 in the stacked structure 410 may determine the number of memory cells included in the memory cell array 301**.

The constituent material of the gate layer 411 may include a conductive material. The conductive material may include but is not limited to tungsten (W), cobalt (Co), Copper (Cu), aluminum (Al), polysilicon, doped silicon, silicide, or any combination thereof. In some examples, each gate layer 411 may include a metal layer, e.g., a tungsten layer. In some examples, each gate layer 411 includes a doped polysilicon layer. Each gate layer 411 may include a control gate surrounding the memory cell. The gate layer 411 at the top of the stacked structure 410 may extend laterally as a top selective gate line, the gate layer 411 at the bottom of the stacked structure 410 may extend laterally as a bottom selective gate line, and the gate layer 411 extending laterally between the top selective gate line and the bottom selective gate line may be used as a word line layer.

In some examples, the stacked structure 410 may be disposed on a substrate 401. The substrate 401 may include silicon (e.g., monocrystalline silicon), silicon germanium (SiGe), gallium arsenide (GaAs), germanium (Ge), silicon-on-insulator (SOI), germanium-on-insulator (GOI), or any other suitable material.

In some examples, the NAND memory string 308 includes a channel structure extending vertically through the stacked structure 410. In some examples, the channel structure includes a channel hole filled with semiconductor material(s) (e.g., as a semiconductor channel) and dielectric material(s) (e.g., as a memory film). In some examples, the semiconductor channel includes silicon, e.g., polysilicon. In some examples, the memory film is a composite dielectric layer including a tunneling layer, a storage layer (also referred to as a "charge trap/storage layer"), and a blocking layer. The channel structure may have a cylindrical shape (e.g., a pillar shape). According to some examples, the semiconductor channel, the tunneling layer, the storage layer and the blocking layer are radially arranged in this order from the center of the pillar toward the outer surface of the pillar. The tunneling layer may include silicon oxide, silicon oxynitride, or any combination thereof. The storage layer may include silicon nitride, silicon oxynitride, or any combination thereof. The blocking layer may include silicon oxide, silicon oxynitride, a high dielectric constant (high-k) dielectric, or any combination thereof. In one example, the memory film may include a composite layer of silicon oxide/silicon oxynitride/silicon oxide (ONO).

Figure 5:
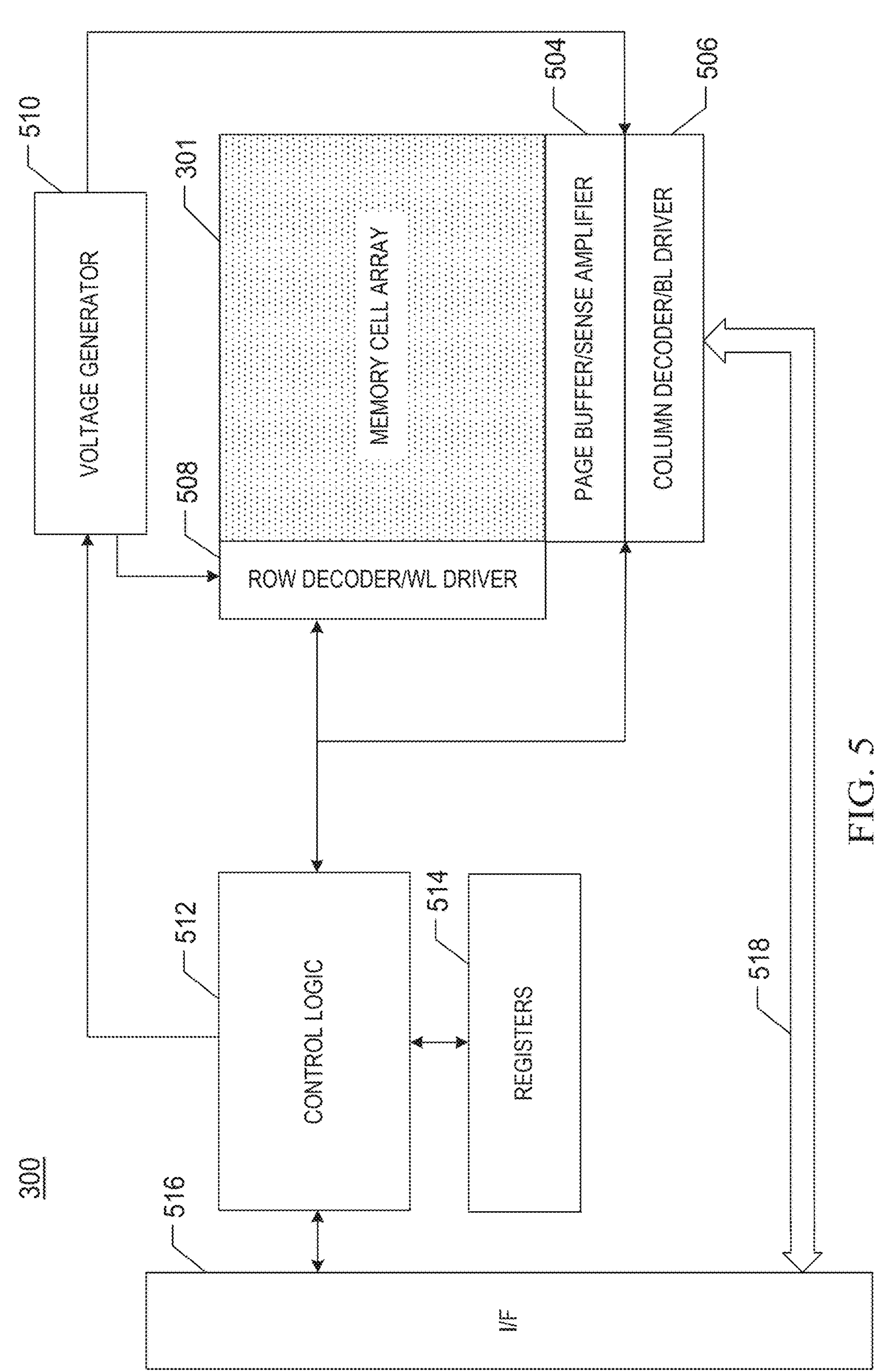
FIG. 5 is a schematic diagram illustrating another example memory device according to examples of the present disclosure.

Referring back to FIG. 3, the peripheral circuit 302 can be coupled to the memory cell array 301 through bit lines 316, word lines 318, source lines 314, BSG lines 315, and TSG lines 313. The peripheral circuit 302 can include any suitable analog, digital, and mixed-signal circuits for facilitating the operations of the memory cell array 301 by applying and sensing at least one of voltage signals or current signals to and from each target memory cell 306 through bit lines 316, word lines 318, source lines 314, BSG lines 315, and TSG lines 313. The peripheral circuit 302 can include various types of peripheral circuits formed using metal-oxide-semiconductor (MOS) technologies. For example, FIG. 5 illustrates some example peripheral circuits, the peripheral circuit 302 including a page buffer/sense amplifier 504, a column decoder/bit line driver 506, a row decoder/word line driver 508, a voltage generator 510, control logic 512, registers 514, an interface 516, and a data bus 518. It is understood that in some examples, additional peripheral circuits not shown in FIG. 5 may be included as well.

The page buffer/sense amplifier 504 can be configured to read and program (write) data from and to the memory cell array 301 according to the control signals from the control logic 512. In one example, the page buffer/sense amplifier 504 may store a page of program data (write data) to be programmed into a memory page of the memory cell array 301. In another example, the page buffer/sense amplifier 504 may perform program verify operations to ensure that the data has been properly programmed into memory cells 306 coupled to selected word lines 318. In still another example, the page buffer/sense amplifier 504 may also sense the low power signals from the bit line 316 that represent data bits stored in the memory cells 306 and amplify the small voltage swing to recognizable logic levels in a read operation. The column decoder/bit line driver 506 can be configured to be controlled by the control logic 512 and select one or more NAND memory strings 308 by applying bit line voltages generated from the voltage generator 510.

The row decoder/word line driver 508 can be configured to be controlled by the control logic 512 and select/deselect memory blocks 304 of the memory cell array 301 and select/deselect word lines 318 of memory blocks 304. The row decoder/word line driver 508 can be further configured to drive word lines 318 using word line voltages generated from the voltage generator 510. In some examples, the row decoder/word line driver 508 can also select/deselect and drive BSG lines 315 and TSG lines 313 as well. As described below in detail, the row decoder/word line driver 508 is configured to perform program operations on the memory cells 306 coupled to the selected word line(s) 318. The voltage generator 510 can be configured to be controlled by the control logic 512 and generate the word line voltages (e.g., read voltage, program voltage, pass voltage, channel boost voltage, verification voltage, etc.), bit line voltages, and source line voltages to be supplied to the memory cell array 301.

In some particular examples, the program operation may comprise a plurality of stages, as an example, the program operation may comprise a channel pre-charge stage, a channel boost stage, a program pulse stage and a recovery stage. In the channel pre-charge stage, the voltage generator may generate a voltage required in a next stage, such as a voltage to be applied to various gates, the channel boost voltage, etc. In the channel boost stage, the channel boost voltage may be applied to the selected word line. In the program pulse stage, a target voltage for each program operation may be applied to the selected word line. In the recovery stage, the voltages of both the unselected and selected word lines may be dropped to their respective voltages such as Vcc and Vdd. The purpose of dropping to the respective voltages may be achieved through one or more stepped voltage drops in the recovery stage, for example, the voltage may be dropped to an intermediate voltage first and held for a period of time at this intermediate voltage, and then is dropped to the respective voltage.

The control logic 512 may be coupled to each peripheral circuit described above and configured to control the operation of each peripheral circuit. Registers 514 can be coupled to the control logic 512 and include status registers, command registers, and address registers for storing status information, command operation codes (OP codes), and command addresses for controlling the operations of each peripheral circuit. The interface 516 may be coupled to the control logic 512 and act as a control buffer to buffer and relay control commands received from a host (not shown) to the control logic 512, and to buffer and relay status information received from the control logic 512 to the host. The interface 516 may further be coupled to the column decoder/bit line driver 506 via the data bus 518 and act as a data I/O interface and data buffer to buffer and relay data to or from the memory cell array 301.

In some examples, the memory cell of the NAND memory may be classified into single-level memory cells (one-bit memory cells), double-level memory cells (two-bit memory cells), triple-level memory cells (three-bit memory cells), quad-level memory cells (four-bit memory cells), and penta-level memory cells (five-bit memory cells) according to a storage density. However, regardless of the single-level memory cell or the multi-level memory cell, the read operation thereof may be performed on a per-page basis. In an example, during the read operation, a read voltage is applied to the word line (e.g., the selected word line) coupled with the selected page in the memory device 104, and when the read voltage reaches a threshold voltage of a plurality of memory cells coupled with the selected word line, or a count of memory cells each having a threshold voltage not reached by the read voltage is within a tolerance range, the read operation of the entire page is ended. The memory cell may be an M-bit memory cell which has $2^M$ memory states comprising an erased state, wherein M bits of stored data are read through $2^M-1$ levels of read voltages. In an example, e.g., a first-level read voltage is between threshold voltages of the erased state and a first data state, when the first-level read voltage is applied to the word line, memory cells in the erased state are turned on, memory cells in the first memory state are turned off, and the erased state and the first memory state are distinguished from each other and read out.

It is to be noted that during a process of the read operation, a memory cell with a target threshold voltage not reached by the read voltage is labeled as an error bit. In order to prevent the read error, an Error Correction Code (ECC) is introduced, so that all error bits in the read operation can be corrected when an error bit count is less than or equal to a maximum count of fail bits that can be corrected by the error correction code. As such, the data may be read properly.

In some examples, the host 108 sends a read command (or a read instruction, a read request) to the memory controller 106 according to a current user command requirement. The memory controller 106 transmits a read control command comprising information such as a logical address-physical address mapping table to the memory device 104 via the interface 516, to control the memory device 104 to perform the read operation on the memory cell corresponding to a respective physical address. The memory device 104 then sends read data to the memory controller 106 via the interface 516. The memory controller 106 feeds back the data to the host 108 via interfaces such as PCIe or SATA. In an example, the memory controller 106 sends the read control command to the control logic of the memory device via the interface 516, and the control logic applies a related operation voltage to the selected word line or bit line according to a related physical address, so as to perform the read operation on the corresponding memory cell. The control logic may control the voltage generator to generate, according to a related read voltage mapping table, the related operation voltage, which is decoded by the row decoder and then applied to the word line of the respective address, or decoded by the column decoder and then applied to the bit line of the respective address.

Figure 6:
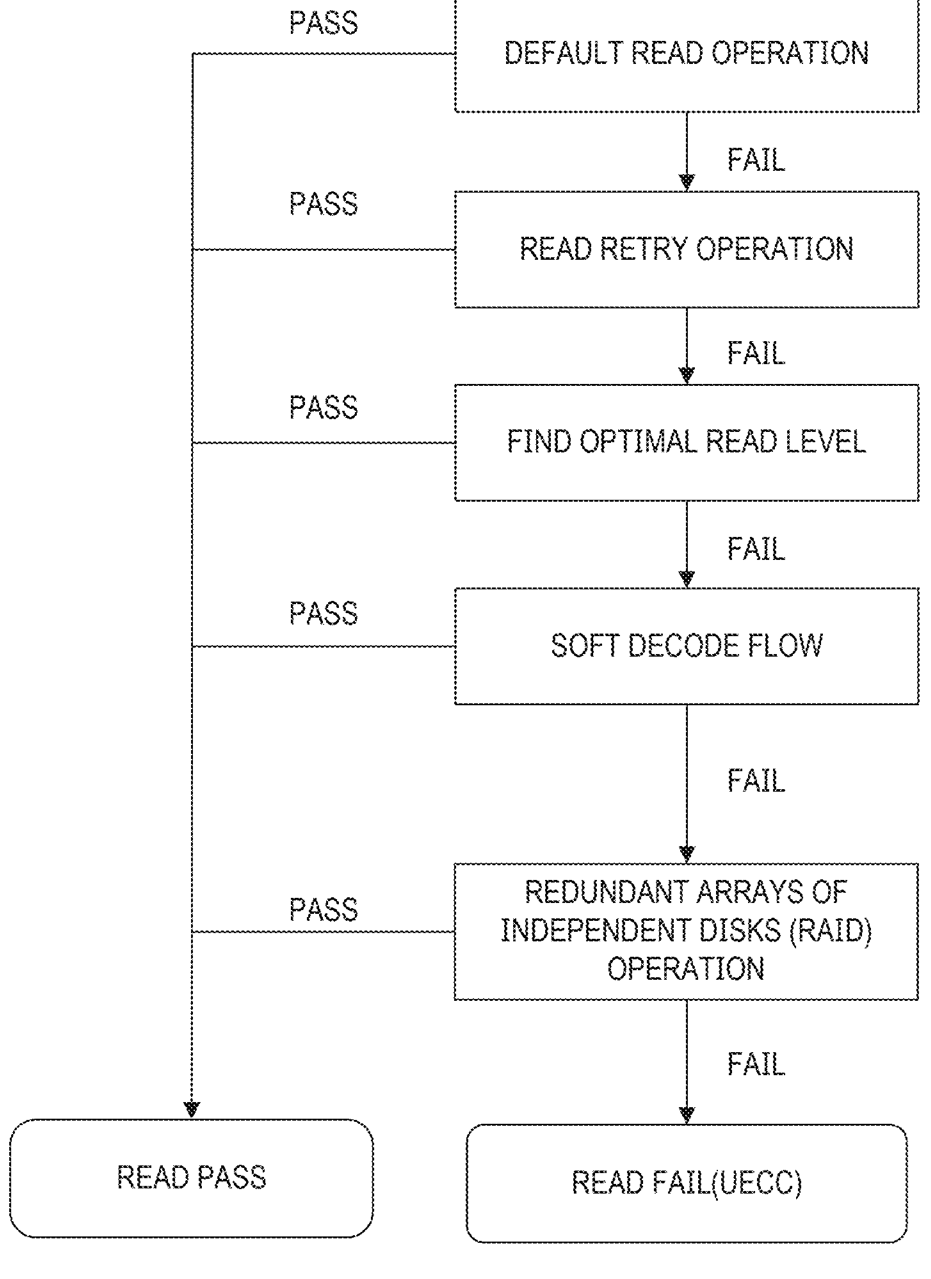
FIG. 6 is a schematic flow diagram illustrating a read operation according to examples of the present disclosure.

In some other examples, a read error occurs when the memory device 104 reads the respective memory cell under the control of the memory controller 106. At this time, the memory controller 106 (or an error correction module in the memory controller 106) controls the memory device 104 to perform error correction in response to a read operation fail, wherein an error correction mode may include ECC error correction. According to some aspects of examples of the present disclosure, FIG. 6 illustrates a schematic flow diagram of an example read operation of the memory system 102. Referring to FIG. 6, when the memory controller 106 controls the memory device 104 to perform the read operation, a default read operation is first performed on the memory cell of a respective physical address. After the default read fails, an access to a read retry table (RRT) is performed to acquire a voltage offset value, and the voltage offset value and a default read voltage are summed to obtain a read retry voltage for a read retry operation. The read retry operation and the default read operation may employ a hard bit decode (HB decode). After the read retry fails, an operation of finding an optimal read level, which may also be referred to as a valley voltage search operation, is performed. A positive or negative offset is performed based on the default read voltage or a read voltage for the current read fail, whereby an optimal read voltage is obtained by increasing or decreasing the voltage for performing a read operation on the memory cell. The read operation with the redetermined optimal read voltage may employ the hard bit decode or soft bit decode (SB decode), or employ the soft bit decode after the hard bit decode fails. After a read operation with the optimal read voltage fails, a soft decode flow, which is also referred to as a soft decision operation, is performed, which may comprise a hard bit read (HB read). The hard read data employs the hard bit decode or updates a log likelihood rate (LLR) table independent of an LDPC algorithm. The soft decode flow may also comprise a soft bit read (SB read), wherein the soft read data employs the soft bit decode. After the soft decode flow fails, a redundant arrays of independent disks (RAID) operation is performed, or a Redundant Array of Independent NAND (RAIN) technology is enabled. After the RAID or RAIN operation fails, the ECC error correction operation stops, a read fail occurs due to inability of the error correction operation, and the memory controller 106 sends a read fail or UECC signal to the host 108.

In an example, RAID may be a disk-level data recovery technology, wherein one memory device 104 may act as one disk, a plurality of disks constitute a disk array, and when a data read error occurs in one or more disks, error data may be recovered through check data and data in a disk in which no error occurs. The check data may be generated during a disk write stage according to written data. The RAIN may be referred to as NAND-level RAID. For the memory device 104 comprising a NAND memory array, the check data may be generated during a program stage based on program data of a plurality of data blocks, and stored in an over-provisioning (OP) area of the memory device 104, wherein one data block may comprise data of one memory cell or of a plurality of memory cells on one word line. When a data read error occurs in one or more data blocks, error data may be recovered according to the check data and data with no error.

The error correction module 1064 (e.g., an ECC module) in the memory controller 106 may control the memory device 104 to perform error correction operations such as the read retry operation, the operation of finding the optimal read voltage, the soft decode flow, and the RAID operation. The control command is sent by the memory controller 106 to the memory device 104 via the interface 516. The memory device 104 feeds back read information to the memory controller 106 via the interface 516. It is to be noted that the performance of subsequent operations may be stopped after any one of the read retry operation, the soft decode flow, and the RAID operation succeeds.

In some particular examples, the soft decode flow may be understood as performing data re-decoding through a decoding unit 1066 (e.g., a soft decoder) in the memory controller 106 and performing the read operation again according to re-decoded data. The RAID operation may be understood as implementing data mirroring through secondary encoding, to rebuild stored data and parity check data thereof, wherein re-encoding of a redundant array for the memory data is typically performed in a data buffer 1067 of the memory controller 106.

Figure 7:
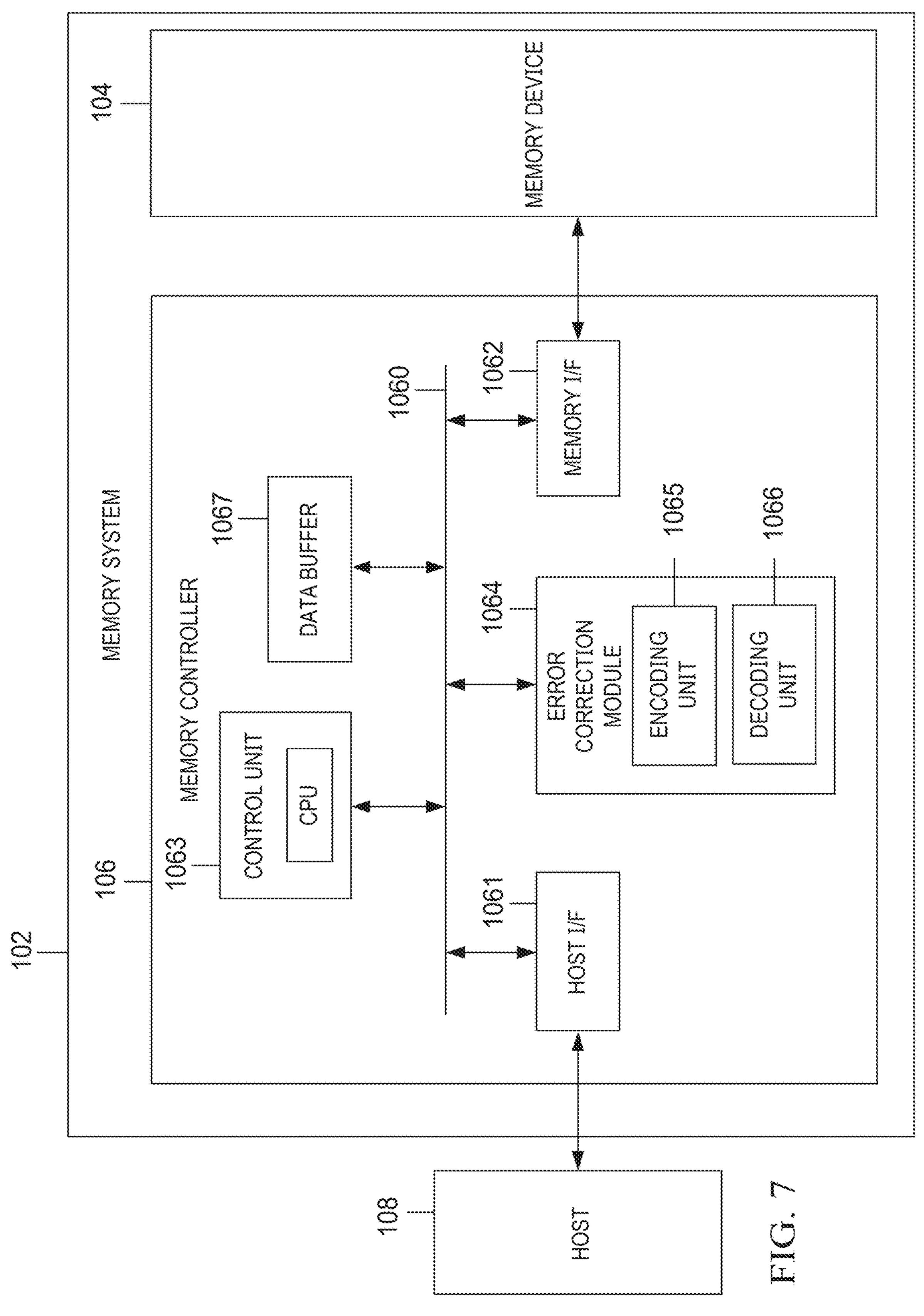
FIG. 7 is a schematic diagram illustrating an example memory system according to examples of the present disclosure.

According to some aspects of examples of the present disclosure, FIG. 7 provides a block diagram of the memory system 102 that comprises the memory controller 106 comprising the error correction module 1064. Referring to FIG. 7, the memory system 102 comprises: the memory controller 106 and a memory device 104, wherein the memory controller 106 and the memory device 104 may be coupled in any suitable pattern. In the examples of the present disclosure, the memory controller 106 comprises a host I/F 1061, a memory I/F 1062, a control unit 1063, the error correction (ECC) module 1064, the data buffer 1067, and an internal bus 1060, wherein the error correction module 1064 comprises an encoding unit 1065 and the decoding unit 1066. The host I/F 1061 outputs a command and user data (write data) etc. received from the host 108 to the internal bus 1060, and sends user data (read data) read from the memory device 104 and a response from the control unit 1063, etc. to the host 108.

The memory I/F controls processing of writing user data etc. to the memory device 104 and reading user data etc. from the memory device 104 based on an instruction of the control unit 1063. The control unit 1063 overall controls the memory system 102, and comprises, for example, a central processing unit (CPU), or a micro-processing unit (MPU), etc. The control unit 1063 performs control according to a command in the case of receiving the command from the host 108 via the host I/F 1061. For example, the control unit 1063 instructs the memory I/F to write the user data and parity check data to the memory device 104 according to the command from the host 108. Furthermore, the control unit 1063 instructs the memory I/F to read the user data and the parity check data from the memory device 104 according to the command from the host 108.

The error correction module 1064 comprises the encoding unit 1065 and the decoding unit 1066, and the encoding unit 1065 encodes the user data with a predetermined size written to the same page to generate the parity check data. The parity check data is written to a page to which the user data as the encoding basis has been written, and the decoding unit 1066 uses the parity check data for decoding. The data buffer 1067 temporarily stores the user data received from the host 108 before storing it to the memory device 104, and temporarily stores the data read from the memory device 104 before sending it to the host 108.

Figure 10:
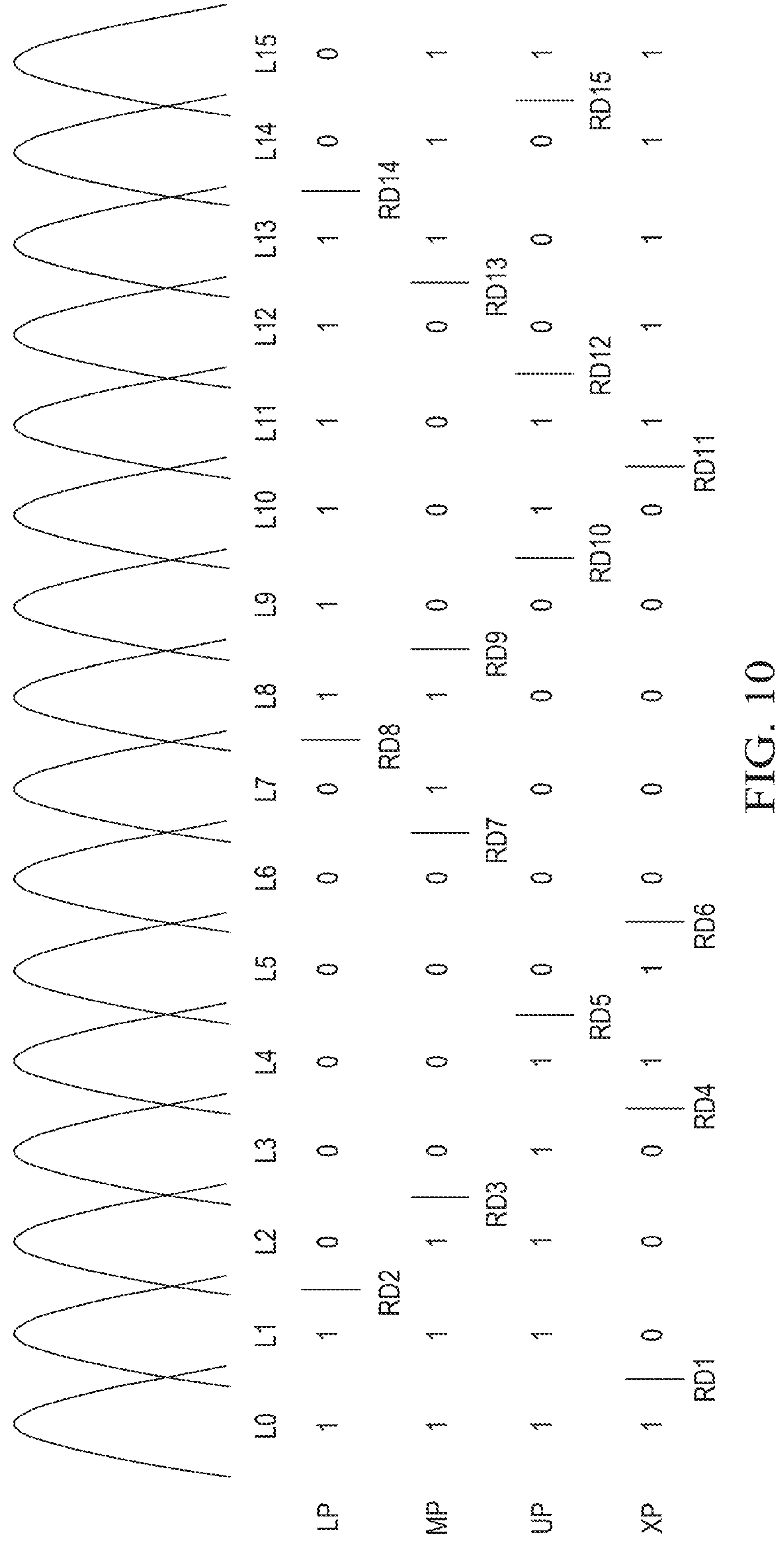
FIG. 10 is a schematic diagram illustrating other example threshold voltages according to examples of the present disclosure.

In some examples, a process of determining a read retry voltage for the read retry operation in FIG. 6 may comprise: acquiring, by the error correction module 1064 in the memory controller 106, a corresponding voltage offset value by querying a corresponding read retry table, wherein the voltage offset value may be either a positive offset value or a negative offset value; and summing the voltage offset value and the default read voltage to obtain the read retry voltage. The memory controller 106 controls the memory device 104 to perform the read retry operation on the memory cell of the corresponding physical address using the read retry voltage. FIG. 8 illustrates an example form of the read retry table for the illustrative purpose only, and the examples of the present disclosure do not limit the form of the read retry table. The read retry table may store or record multi-level read voltages for distinguishing a plurality of data states of the memory cell, e.g., the read retry table stores voltage offset values corresponding to read voltages Rd1-Rd7 in FIG. 8, wherein RR-m entries store respective read voltage offset values, Rd1-Rd7 are used for reading data of a TLC memory cell, and the seven levels of read voltages are used for distinguishing between 8 data states comprising the erased state. For the memory cell with a larger memory bit count, e.g., the QLC memory cell which has 16 data states, the 16 data states are distinguished from each other using 15 levels of read voltages Rd1-Rd15, and a correspondence between the read voltages Rd1-Rd15 and the data states L0-L15 may be as shown in FIG. 10, in which case the read retry table may record voltage offset values corresponding to the read voltages Rd1-Rd15. In an example, in FIG. 10, the read operation is performed on the memory cells, wherein the memory cells each having a threshold voltage less than Rd1 are in the erased state L0, the memory cells each having a threshold voltage between Rd1 and Rd2 are in a state L1, the memory cells each having a threshold voltage between Rd2 and Rd3 are in a state L2, and the memory cells each having a threshold voltage greater than Rd15 are in a state L15.

It is to be noted that the memory controller 106 may query the read retry table in a polling pattern, wherein one read retry table may comprise a plurality of sub-tables, such as m sub-tables, or the arranged entries of a plurality of rows RR-1 to RR-m in FIG. 8, wherein m is a natural number greater than 1. Each sub-table may comprise a voltage offset value for a corresponding data state of a corresponding memory cell, and queries are performed sequentially from the first sub-table to the m-th sub-table, to acquire one voltage offset value by one query, and then the voltage offset value and the default read voltage are summed to obtain one read retry voltage, which is used by the memory device 104 to perform the read operation. One read retry operation may comprise at most m read sub-operations, and the examples of the present disclosure are not limited thereto. For example, V1 illustrated in the read retry table is a voltage offset value of the read voltage Rd1, and during polling of the read retry table, the queries may be performed successively starting from RR-1 to RR-m of the first index, to obtain the read retry voltages sequentially and carry out the read retry operation until the read operation succeeds.

In some examples, the read retry table may correspond to default read voltages for the respective data states, and the read retry voltage is obtained by summing the default read voltage and the voltage offset value recorded in the read retry table. The default read voltage is a calibrated value determined in factory tests of the memory device, and is stored in the memory device for retrieval by the memory controller or peripheral circuit of the memory device. A reference value for each level of read voltage and a sum for each voltage offset value in the read retry table may vary, e.g., the default read voltage corresponding to each data state may vary. In some other examples, after a read fail of the memory cell, using the current read voltage of the read fail as a reference, the read retry voltage is obtained by summing the voltage offset value obtained by querying the read retry table and the current read voltage, wherein the current read voltage of the read fail may be a real-time value and may not be equal to the default read voltage.

Figure 9:
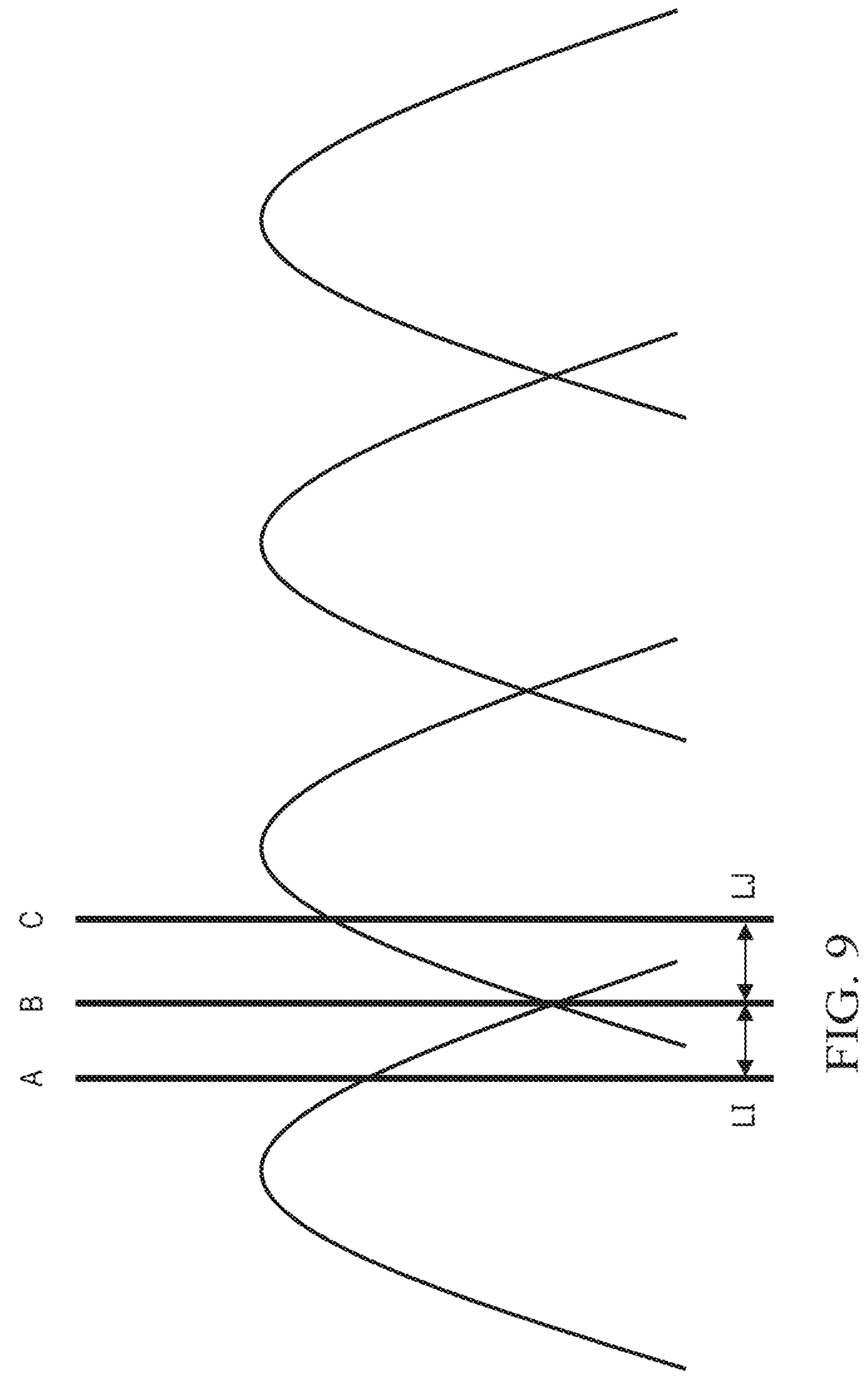
FIG. 9 is a schematic diagram illustrating example threshold voltages according to examples of the present disclosure.

In some examples, a search for an optimal read voltage may be performed when the read retry operation fails. Referring to FIG. 9, taking threshold voltage distribution peaks of any two adjacent data states Li and Lj as an example, an optimal read voltage between the two data states is a valley voltage indicated by a line B. A threshold voltage offset causes an original read voltage to shift to a line A or line C relative to the current threshold voltage. When the read voltage is shifted to the line A, it is required to shift the read voltage in a positive direction towards the valley voltage at the line B; when the read voltage is shifted to the line C, it is required to shift the read voltage in a negative direction towards the valley voltage at the line B. As such, the optimal read voltage is found to read the memory cell properly.

In some examples, with reference to FIG. 9 and FIG. 10, during programming of the memory cells, writing may be performed based on data randomization. During programming of the memory cells of a minimum program unit (or a minimum program area) in the memory device, the memory cells of the minimum program unit comprise all of the memory cells on one word line or memory cells on a partial area where read and write operations can be performed independently of one word line. Count of each of the data states is equal or approximately equal within a certain margin of error, the memory cell of which a target data state is the erased state will not be programmed, a threshold voltage distribution of each data state is a normal distribution, and the area of the threshold voltage distribution peak of each data state is equal or approximately equal within a certain margin of error. FIG. 10 illustrates a threshold voltage distribution of the QLC, wherein the horizontal axis is the threshold voltage, and the corresponding value on the normal distribution curve is a bit count. A total count of memory cells of the minimum program unit is Z, and the QLC has a total of 16 data states, wherein a count of memory cells corresponding to each data state may be configured as Z/16. However, in the subsequent read process, due to the threshold voltage offset, if the read operation is still performed using the read voltage determined from the random threshold voltage distribution, bit counts corresponding to some data states may differ from Z/16 greatly, causing some memory cells programmed to be in the Li state being read as the Lj state during the reading process, or some memory cells programmed to be in the Lj state being read as the Li state during the reading process.

Figure 11:
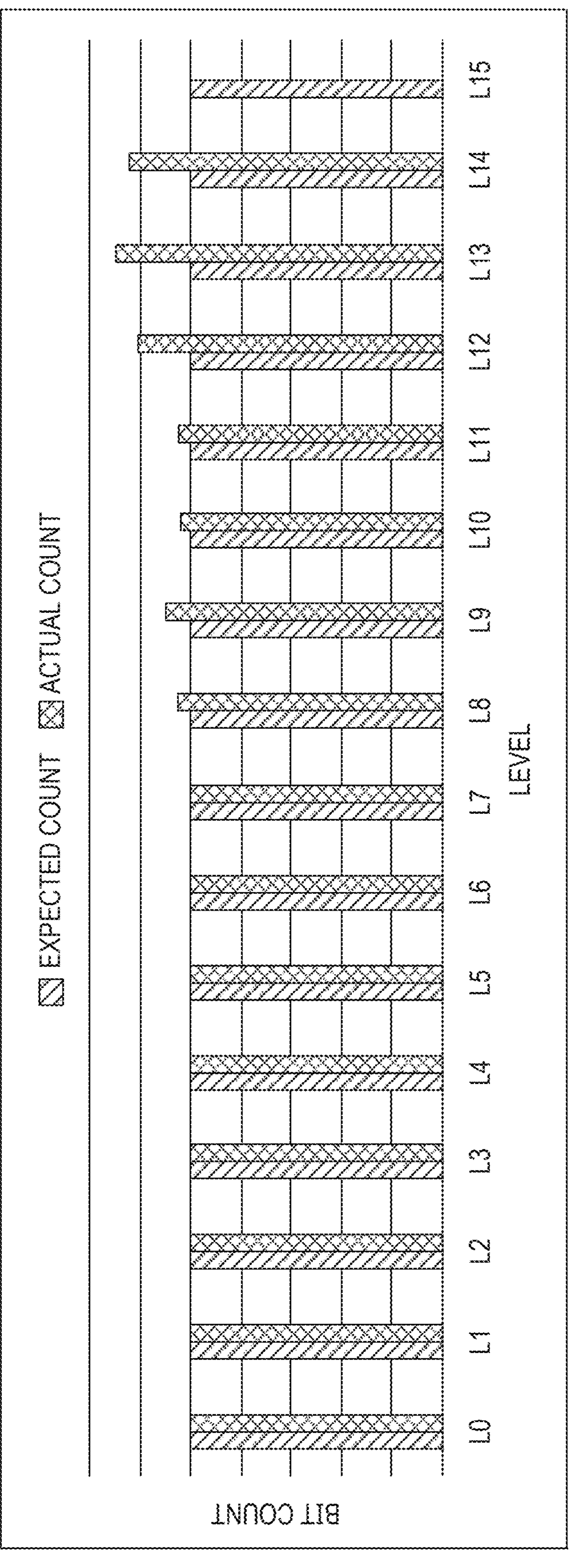
FIG. 11 is a schematic diagram illustrating a bit count distribution according to examples of the present disclosure.

In some examples, as illustrated in FIG. 11, based on a program logic of the random distribution, when the threshold voltage of the memory cell is not offset or the threshold voltage offset is not considered, the read bit count of each data state is an expected count, which may be an expected count set to be achieved during the program operation, and an actually read bit count of each data state is an actual count. The threshold voltage offset causes actual counts of certain data states to be greater than or less than an expected count, and a difference between the two counts is larger than a predetermined deviation range, thereby causing a read error. For example, an actual count corresponding to the data state L14 is greater than an expected count, and a difference exceeds the predetermined deviation range. In some other examples, the expected count may be a preset value calibrated during a factory test stage of the memory device 104 or the memory system 102, the preset value may be set based on a Gray code encoding rule of the memory cell, and the expected count may be stored in a certain memory area of the memory device 104 as the preset value for retrieval by the memory controller 106.

In some examples, the memory cell of the examples of the present disclosure may be configured to store M bits of data and have $2^M$ data states, wherein the $2^M$ data states are read through N levels of read voltages, and $N=2^M-1$. The N levels of read voltages may be divided into M groups, wherein each group comprises at least one level of read voltage, and grouping of the read voltages may be determined according to an encoding rule, which may include, but is not limited to, the Gray code encoding rule. It is to be noted that the typical binary Gray code is referred to as Gray code. In encoding of a group of numbers, if any two adjacent codes differ from each other in only one binary digit, then such encoding is referred to as Gray code. In addition, as the maximum number and the minimum number also differ from each other in only one binary digit, e.g., "end to end", it is also referred to as a cyclic code or reflective code. There are various other encoding forms of the Gray code, such as a decimal number encoding form, and a four-bit natural binary encoding form, etc. A code table of the Gray code is produced through recursion, e.g., a two-bit Gray code, a three-bit Gray code, and a four-bit Gray code, etc. In some examples, the M groups of the multi-level read voltages may correspond to M classes of pages (or M pages), and a respective level of read voltage for distinguishing of respective bits of data corresponding to each class of page is determined according to the encoding rule.

In an example, in the case of M=2, the memory cell is configured to store two bits of data, and at this time, the memory may comprise two classes of pages, e.g., an upper page and a lower page. The two-bit memory cell requires three levels ($3=2^2-1$) of read voltages to read the two bits of data stored therein. In an example, the two bits of data stored in the memory cell correspond to four states (one erased state and three programmed states), e.g., four voltage ranges are assigned for four data values. During the read operation, the two bits of data stored in the memory cell are read by applying the three levels of read voltages for distinguishing between the four voltage ranges. The upper page corresponds to one level of read voltage, and the lower page corresponds to two levels of read voltages.

In the case of M=3, the memory cell is configured to store three bits of data, and at this time, the memory may comprise three classes of pages, e.g., an upper page (UP), a middle page (MP), and a lower page (LP). The three-bit memory cell requires seven levels ($7=2^3-1$) of read voltages to read the three bits of data stored therein. In an example, the three bits of data stored in the memory cell correspond to eight states L0-L7 (one erased state and seven programmed states), e.g., eight voltage ranges are assigned for eight data values. During the read operation, the three bits of data stored in the memory cell are read by applying the seven levels of read voltages for distinguishing between the eight voltage ranges. The upper page may correspond to two levels of read voltages, Rd3 and Rd7; the middle page may correspond to three levels of read voltages, Rd2, Rd4, and Rd6; and the lower page may correspond to two levels of read voltages, Rd1 and Rd5. L0-L7 are encoded using a three-bit Gray code and may be encoded into 111, 110, 100, 000, 101, 011, 001, and 101 respectively.

In the case of M=4, the memory cell is configured to store four bits of data and as shown in FIG. 10, the memory comprises four classes of pages, e.g., an upper page (UP), a middle page (MP), a lower page (LP), and an extra page (XP). The four-bit memory cell corresponds to fifteen levels ($15=2^4-1$) of read voltages to read the four bits of data stored therein. In an example, the four bits of data stored in the memory cell correspond to sixteen data states (one erased state and fifteen programmed states), e.g., sixteen voltage ranges are assigned for sixteen data values. During the read operation, the four bits of data stored in the memory cell are read by applying the fifteen levels of read voltages for distinguishing between the sixteen voltage ranges. The lower page LP corresponds to the three levels of read voltages, Rd2, Rd8, and Rd14; the middle page MP corresponds to four levels of read voltages, Rd3, Rd7, Rd9, and Rd13; the upper page UP corresponds to four levels of read voltages, Rd5, Rd10, Rd12, and Rd15; and the extra page XP corresponds to four levels of read voltages, Rd1, Rd4, Rd6, and Rd11. The optimal read voltage may be at a valley between two adjacent threshold voltage distribution peaks, e.g., Rd1 is between the threshold voltages L0 and L1 and at the valley therebetween. L0-L15 are encoded using a 4-bit Gray code and may be encoded into 1111, 1110, 0110, 0010, 0011, 0001, 0000, 0100, 1100, 1000, 1010, 1011, 1001, 1101, 0101, 0111, respectively. During the read operation, the read voltages Rd1-Rd15 are applied for distinguishing between the data states L0-L15, e.g., the state L0 corresponds to a threshold voltage less than Rd1, the state Li corresponds to a threshold voltage between Rd1 and Rd2, and the state L15 state corresponds to a threshold voltage greater than Rd15. The read voltages may be applied according to the pages during the read operation. For example, Rd2, Rd8, and Rd14 corresponding to the LP may be applied to read the LP, wherein the memory cell with a threshold voltage less than Rd2 is read as 1, the memory cell with a threshold voltage between Rd2 and Rd8 is read as 0, the memory cell with a threshold voltage between Rd8 and Rd14 is read as 0, and the memory cell with a threshold voltage greater than Rd14 is read as 0. Rd3, Rd7, Rd9, and Rd13 corresponding to the MP may be applied, wherein the memory cell with a threshold voltage less than Rd3 is read as 1, the memory cell with a threshold voltage between Rd3 and Rd7 is read as 0, the memory cell with a threshold voltage between Rd7 and Rd9 is read as 1, the memory cell with a threshold voltage between Rd9 and Rd13 is read as 0, and the memory cell with a threshold voltage greater than Rd13 is read as 1. After similar applications of the read voltages corresponding to the UP and MP, the read data is aggregated for decoding, e.g., reading a bit value for each data state, e.g., 1111 for L0.

In some examples, according to the read logic of the read operation, a mapping relationship between the voltage offset value and a difference between the actual count and the expected count of each data state is created based on the difference shown in FIG. 11, and the mapping relationship is mapped to the voltage offset value in the read retry table to facilitate the query of the read retry table. In an example, when Rd1-Rd15 are applied to the memory cells, a statistical result of the bit count corresponding to each data state shown in FIG. 11, for example, is acquired. Taking the state L14 as an example, a difference corresponding to the state L14 may have a mapping relationship with an optimal voltage offset value of Rd14, and the mapping relationship may be a linear or fitted linear relationship, and may be test-calibrated data in the factory test stage of the memory device, and is stored in the memory device for retrieval by the memory controller or peripheral circuit. The optimal voltage offset value of Rd14 is such that when there is a difference between an actual count and an expected count for the read operation corresponding to the state L14, a read retry voltage obtained by summing Rd14 and the optimal voltage offset value can correct the read error, or the optimal voltage offset value may cause an actual count of the subsequent read operation corresponding to the state L14 to be close to the expected count and within a preset error range, so as to read the data properly. Differences and optimal voltage offset values for read operations corresponding to other data states are referred to the state L14, for example, a mapping relationship between a difference for a read operation corresponding to the state L13 and an optimal voltage offset value of Rd13 is created, and the operations for other data states are no longer repeated here.

Figure 12:
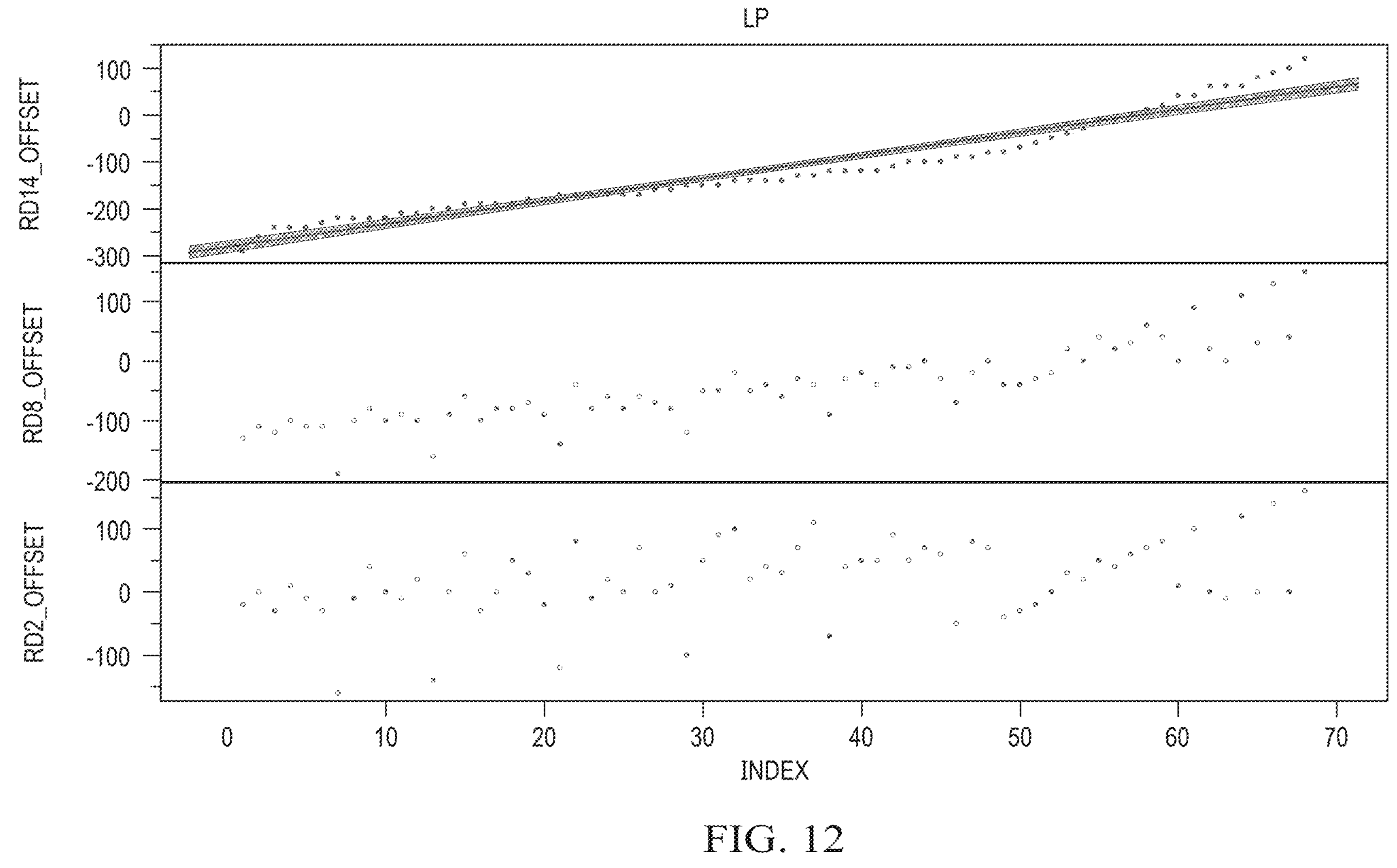
FIG. 12 is a schematic diagram illustrating a read voltage offset value according to examples of the present disclosure.

Referring to FIG. 12, the voltage offset values corresponding to Rd14 in the read retry table are sorted in order of magnitude from negative to positive, mapping is created between the voltage offset value and an index value, wherein one index value corresponds to one voltage offset value Rd14_offset, and linear fitting of Rd14_offset is performed to obtain a linear relationship between Rd14_offset and the index value. According to the difference between the actual count and the expected count for the current read operation corresponding to the state L14, the optimal voltage offset value is acquired through the mapping relationship between the optimal voltage offset value of Rd14 and the difference. The index value is calculated according to the optimal voltage offset value by using the linear relationship between Rd14_offset and the index value shown in FIG. 11, and using the calculated index value as a reference, the voltage offset value of at least one index is acquired from the re-sorted read retry table to calculate the read retry voltage. The calculated index value may be an integer or a non-integer, and an index acquired from the read retry table may be equal to the calculated value, or a plurality of index values are acquired, and a numerical value range constituted by the plurality of acquired index values comprises the calculated index value. The calculated index value may be rounded. In FIG. 12, other read voltage offset values for the same class of page, the LP, may also be arranged in order of voltage magnitude, e.g., a mapping relationship between Rd8_offset and index, and a mapping relationship between Rd2_offset and index. In this example, a part of the indexes of the read retry table may be polled based on the calculated index value, without polling the read retry table starting from the first index, but only a part of indexes of the read retry table may be matched for the read retry operation, resulting in high use efficient.

In some other examples, a memory system is provided with a memory controller that may also implement polling of a portion of the read retry table, to improve the access efficiency of the read retry table. Furthermore, a single level read (SLR) mode is employed, wherein after the read operation is performed using only one level of read voltage, a magnitude relationship between the threshold voltage and the level of read voltage is compared, and the index value is calculated according to a count of memory cells having threshold voltages greater than the read voltage and a count of memory cells having threshold voltages less than the read voltage, and is matched with an index range of the read retry table, such that there is no need to acquire the difference for the read operation corresponding to each data state after all the read voltages are applied, thereby reducing the time of the read retry operation and improving the operation rate of the memory system. In some particular examples, taking a memory system of the QLC memory cells as an example, the single level read of the examples of the present disclosure can reduce the time of one read retry operation by 73% or more, compared to a solution of a multi-level read. Details are provided as below.

According to some aspects of examples of the present disclosure, there is provided the memory system 102 comprising: a memory device 104 comprising a plurality of memory cells, wherein each of the plurality of memory cells is configured to be in one of a plurality of data states; and a memory controller 106 coupled with the memory device and configured to: perform a read operation using a test read voltage corresponding to a selected data state among the plurality of data states; acquire a count of memory cells each having a threshold voltage that satisfies a preset condition, wherein the preset condition comprises: the threshold voltage being less than or equal to the test read voltage, or the threshold voltage being greater than or equal to the test read voltage; determine a difference between the count and an expected count; and acquire at least one read retry voltage according to the difference, a mapping relationship, and a read retry table, wherein the mapping relationship comprises a correspondence between an expected voltage offset value and the difference.

The memory controller 106 controls the memory device 104 to perform the read operation using the test read voltage, the memory controller 106 sends an operation instruction and corresponding address information to the memory device 104 to control the memory device 104 to enable a single level read mode, and the memory controller 106 performs, in response to the operation instruction, a single level read operation on a memory cell on the respective address using the test read voltage. The single level read mode comprises reading at least one bit of data stored in the memory cell through one level of read voltage, wherein the memory cell is configured as an SLC and read using a test read voltage RL, and statistics of bit information read from the memory cell is collected. The memory cell having a threshold voltage less than or equal to the test read voltage is read as 1, and the memory cell having a threshold voltage greater than the test read voltage is read as 0, without applying multi-level test read voltages prior to collecting statistics of the bit information. The test read voltage corresponds to the read voltages such as Rd1, Rd2, etc., for example, the test read voltage RL1 may be equal to the default Rd1, or RL1 is a voltage obtained from Rd1 after offsetting, error correction, or other operations, and RL1 may be offset within a particular range based on the default Rd1. The statistics collection for the count of memory cells having threshold voltages less than or equal to the test read voltage, or the statistics collection for the count of memory cells having threshold voltages greater than the test read voltage may be performed by the peripheral circuit of the memory device 104, and sent to the memory controller 106. Alternatively, the memory controller 106 can acquire the statistics information autonomously. The memory controller 106 acquires the difference according to a comparison of the count with the expected count and performs a subsequent operation of accessing the read retry table. The relevant count may also be acquired by the memory controller 106 according to read information.

Figure 13:
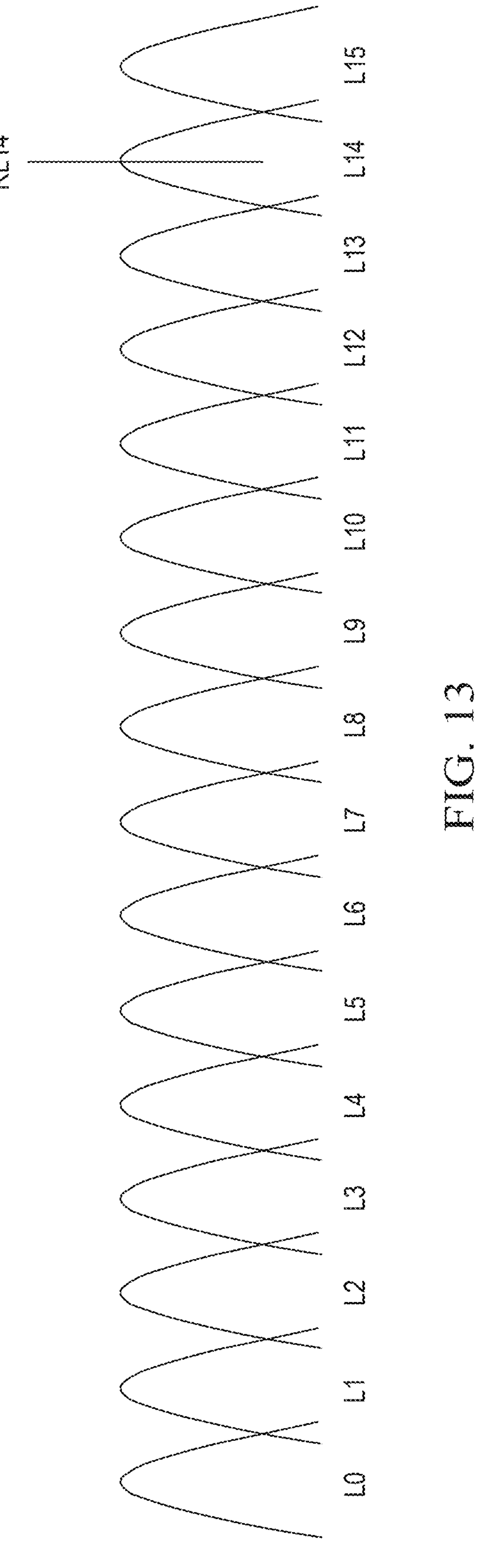
FIG. 13 is a schematic diagram illustrating example test read voltages according to examples of the present disclosure.

Referring to FIG. 13, taking the QLC memory cell as an example, which is configured to be in 16 data states L0-L15 comprising an erased state L0. Taking the state L14 as the selected data state and performing the read retry operation when the read operation using the read voltage Rd14 corresponding to the state L14 fails as an example, operations of determining read retry voltages based on test read voltages corresponding to other selected data states may be referred to the operation of determining the read retry voltage based on Rd14 in this example. It is to be noted that, based on the read logic of the multi-bit memory cell, all the data states are distinguished from each other after the read operation using the multi-level read voltage. The read voltage may be located between the threshold voltage peaks of two data states, e.g., at the valley, and the read voltages corresponding to the plurality of data states in this example is used for distinguishing of only a certain level of read voltage. One level of read voltage may correspond to any one or both of the adjacent data states distinguished from it, for example, the read voltage Rd14 may correspond to the state L14, or may correspond to the state L13, or the read voltage Rd14 may be a read voltage between the state L13 and the state L14. In this example of the present disclosure, Rd14 corresponds to the state L14, and Rd7 corresponds to the state L7, which are no longer repeated below.

With reference to the flow diagram of the read operation shown in FIG. 6, a read operation is performed before the read retry operation to confirm whether the data has been read properly, and when an error occurs, the read retry operation is performed and an access to the read retry table is carried out. The read operation may be performed using the default read voltage stored in the memory device 104. The default read voltage may be a reference voltage corresponding to the read retry table and used for summing with the voltage offset value acquired from the read retry table to obtain the read retry voltage. Alternatively, the read operation before the read retry may also be a real-time read operation, wherein the read voltage may be different from the default read voltage and may be any read voltage obtained after offsetting, error correction, or other operations, which can be labeled as the test read voltage for distinguishing from the default read voltage.

Taking the test read voltage RL14 corresponding to the state L14 in FIG. 13 as an example, RL14 is no longer the optimal read voltage due to the offset of the threshold voltage, and an optimal read location may be at the valley between L13 and L14, which requires a negative offset to obtain the optimal read voltage for the read retry. For offset scenarios of other threshold voltages or RL voltages corresponding to other states, a positive offset may be required to obtain the optimal read voltage. The read retry operation is performed upon a failure of the default read operation using the test read voltage RL14. The single level read mode of the memory device 104 is enabled, and a single level read operation is performed on the memory cell using RL14, wherein memory cells each having a threshold voltage less than or equal to the test read voltage RL14 are read as 1, a count of such memory cells is labeled as a first count, and a preset count of memory cells each having a threshold voltage of the state L14 less than or equal to Rd14 (a count of memory cells set to be programmed to the state L14) is a first expected count; memory cells each having a threshold voltage greater than the test read voltage RL14 are read as 0, a count of such memory cells is labeled as a second count, and a preset count of memory cells each having a threshold voltage of the state L14 greater than Rd14 is a second expected count. In an example, as shown in FIG. 13, during the single level read operation using the test read voltage, the memory cells on the left of RL14 each having a threshold voltage less than or equal to the test read voltage RL14 are turned on, the read operation thereof is passed, and at this time, the count of memory cells on which the read operation is passed is labeled as the first count; the read operation on the memory cells each having a threshold voltage greater than the test read voltage RL14 is not passed, and the count of such memory cells is labeled as the second count.

Figure 14:
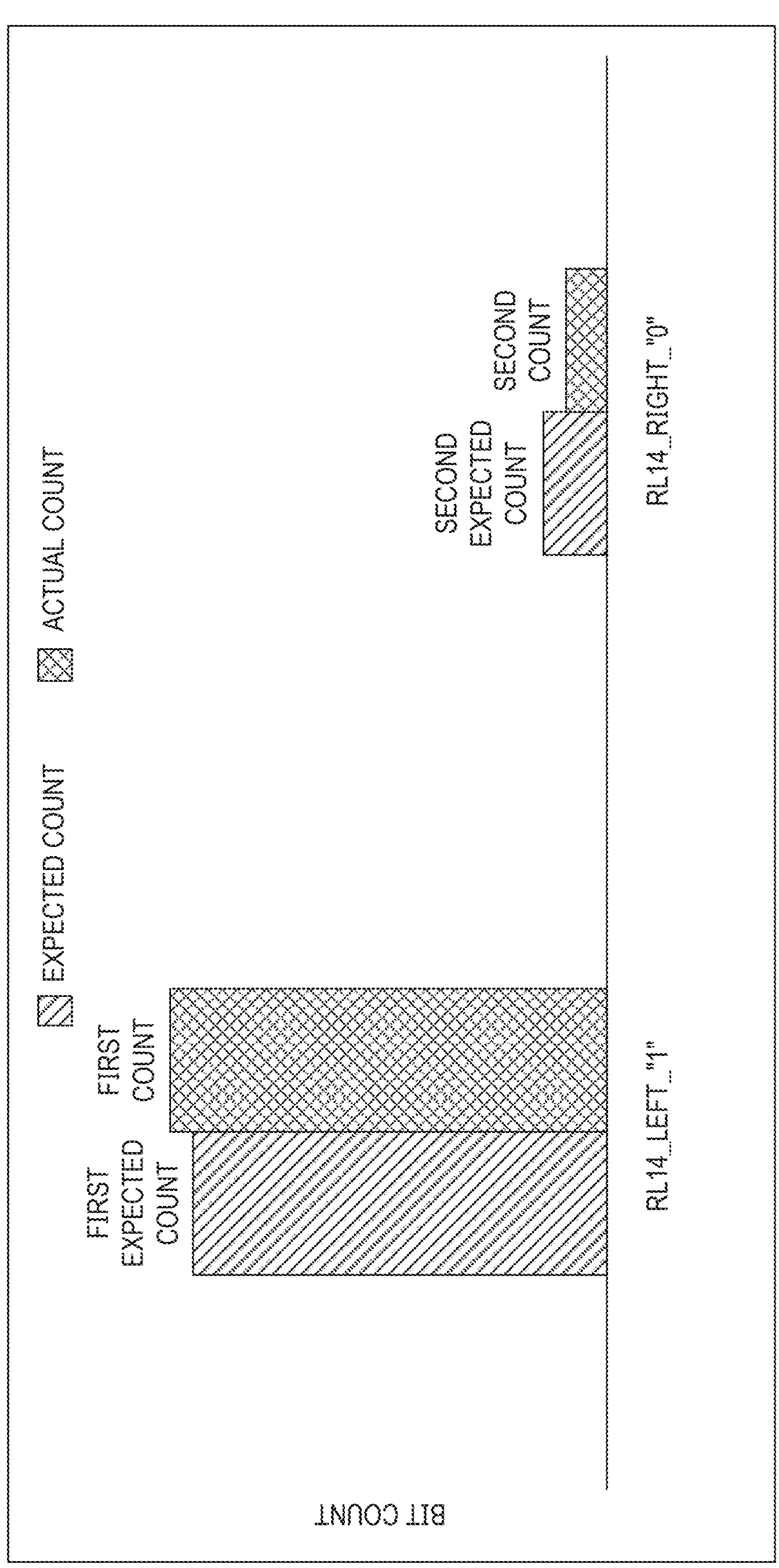
FIG. 14 is a schematic diagram illustrating an example memory cell count distribution according to examples of the present disclosure.

As shown in FIG. 14, RL14_left "1" represents the memory cells each having a threshold voltage less than or equal to the test read voltage RL14, and RL14_left "0" represents the memory cells each having a threshold voltage greater than the test read voltage RL14. The first count and the second count of a test read operation are actual counts, which are real-time read values; the first expected count and the second expected count are preset calibrated expected counts, which are preset values. Based on the program logic of the random distribution, the first expected count may be $\frac{14}{15}$ of a total count of the memory cells in a single program, and the second expected count may be $\frac{1}{15}$ of the total count of the memory cells in the single program. The first count has a first difference from the first expected count, and the second count has a second difference from the second expected count, and the first difference and the second difference each has a mapping relationship with an optimal offset value (or the expected voltage offset value) for adjusting the current test read voltage RL14 to the optimal read voltage. The mapping relationship may be a linear or fitted linear relationship, and the expected voltage offset value may allow the difference to be reduced to within the read error allowance range or eliminated after the current test read voltage offset. The mapping relationship is obtained by test calibration during the factory test stage of the memory system 102 or the memory device 104, and is stored in the memory device 104 for retrieval by the memory device 104 or the memory controller 106.

In some particular example, the memory controller 106 may retrieve the corresponding mapping relationship between the expected voltage offset value and the difference according to the real-time first difference or second difference, calculate or acquire the expected voltage offset value according to the difference and the mapping relationship, and match the read retry table using the calculated expected voltage offset value as a reference, to obtain one or more voltage offset values, wherein the voltage offset values in the read retry table may be arranged in order of magnitudes of the voltage offset values. The voltage offset values in the read retry table are determined based on the default read voltage or reference voltage thereof, and the test read voltage may have a voltage difference from the default read voltage. Before the matching of the read retry table, it is required to sum the expected voltage value calculated according to the mapping relationship and the voltage difference to obtain a first expected voltage value. When the voltage difference is 0, the test read voltage is equal to the default read voltage, the expected voltage value obtained from the mapping relationship is the first expected voltage value, and using the first expected voltage value as a reference to acquire one or more voltage offset values from the read retry table which are equal to or similar to the first expected voltage offset value. Alternatively, the plurality of voltage offset values form a range that comprises the first expected voltage offset value. Moreover, the voltage offset values acquired from the read retry table and the default read voltage are summed sequentially, to obtain the read retry voltage for the read retry operation, thereby reducing the count of polling times of the read retry table and reducing the time for acquiring the first count or the second count in the single level read mode to improve the operating rate.

In the examples of the present disclosure, accessing the read retry table after the first count or the second count is acquired to perform the read retry operation in the single level read mode may reduce the time of a single read retry operation by 73% or more, compared with accessing the read retry table after the read operations using all the read voltages are completed to perform the read retry operation.

In some examples, referring to FIG. 14, the first count of memory cells each having a threshold voltage less than the test read voltage among the plurality of memory cells is greater than a second count of memory cells each having a threshold voltage greater than the test read voltage among the plurality of memory cells.

As for selecting the first count or the second count as a statistical object, the selection may be performed according to the data state corresponding to test read voltage to be corrected. If the test read voltage corresponds to a low data state, such as the L1 state corresponding to RL1, the first count of memory cells each having a threshold voltage less than the test read voltage RL1 is less than the second count of memory cells each having a threshold voltage greater than the test read voltage RL1, and at this time, the second count and the second expected count may be selected to construct the mapping relationship, so as to obtain a larger statistical base to reduce the error. If the test read voltage corresponds to a high data state, such as the L14 state corresponding to RL14 in FIG. 14, the first count is greater than the second count, and the first count and the first expected count may be selected to construct the mapping relationship.

In some examples, the count comprises a first count of memory cells each having a threshold voltage less than or equal to the test read voltage among the plurality of memory cells, the expected count comprises a first expected count, which is a preset count of memory cells each having a threshold voltage less than or equal to a default read voltage among the plurality of memory cells, the mapping relationship comprises a first mapping relationship, which is acquired based on the first expected count, and the memory controller 106 is further configured to: acquire a first expected voltage offset value according to a first difference between the first count and the first expected count, the first mapping relationship, and a voltage difference between the test read voltage and the default read voltage; and acquire at least one first voltage offset value from the read retry table according to the first expected voltage offset value.

Taking the test read voltage RL14 corresponding to the state L14 as an example, the first count and the first expected count in FIG. 14 are selected to construct the first mapping relationship. A default read voltage corresponding to the state L14 has a correlation with the calibrated count, and the default read voltage may be at a valley between threshold voltage distribution peaks of the state L14 and the state L15. The first expected count is the calibrated count of memory cells to be programmed to the state L14. A mapping relationship between a first difference between the first count and the first expected count and the expected voltage offset value is the first mapping relationship, and the first mapping relationship is known calibrated data and stored in the memory device for retrieval by the memory controller. The first count and the first difference acquired by the subsequent test read operations are current real-time values. The voltage difference between the test read voltage and the default read voltage is determined, the single level read operation is performed on the memory cells using the test read voltage to acquire the real-time first count, the first difference between the first count and the first expected count is determined, the expected offset value of the test read voltage is acquired or calculated according to the first difference and the first mapping relationship, and the expected offset value and the voltage difference are summed to obtain the first expected voltage offset value. Using the first expected voltage offset value as a reference, at least one first voltage offset value is acquired from the read retry table, and the first voltage offset value and the default read voltage corresponding to the read retry table are summed to obtain the read retry voltage.

Figure 15:
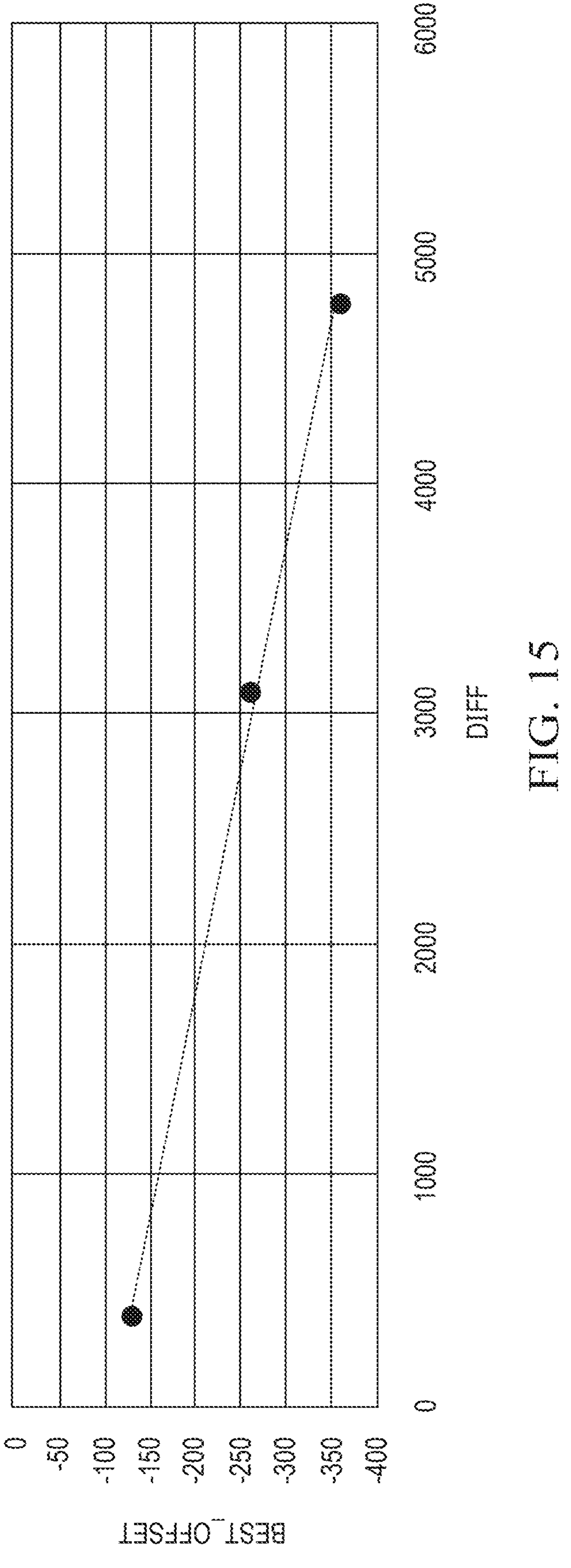
FIG. 15 is a schematic diagram illustrating an example mapping relationship according to examples of the present disclosure.

In some examples, referring to FIG. 15, the first mapping relationship between the expected voltage offset value (best_offset) and the first difference (Diff) is created based on the first count and the first expected count for the read voltage offset value Rd7 (corresponding to the test read voltage RL7) corresponding to the state L7 of the TLC memory cell, and the first mapping relationship may be a linear relationship or a fitted linear relationship. Here, the first expected voltage offset value is a sum of the expected voltage offset value best_offset acquired from the mapping relationship and the voltage difference between the test read voltage and the default read voltage, and the first voltage offset value is at least one of numerical values corresponding to Rd7 as shown in FIG. 16, which is recorded in the read retry table and used for acquiring the voltage offset value applied to the read retry operation.

In some examples, the at least one first voltage offset value is stored in the read retry table in order of magnitude.

Referring to FIG. 16, the read retry table stores the voltage offset values corresponding to Rd7 in order of magnitude. The pre-sorting read retry table is arranged according to original indexes RR-24 to RR-33. The re-sorted read retry table is arranged according to the magnitudes of the voltage offset values corresponding to Rd7, and new indexes 3 to 9 are provided, wherein the voltage offset values of different indexes may be the same or different. The examples of the present disclosure do not limit the number of index entries in the read retry table or specific numerical values of the voltage offset values, and FIG. 16 is merely an example illustration. The sorting of the read retry table may be performed prior to the access to the read retry table by the memory controller 106, or the read retry table is sorted during the factory test stage and stored in the memory device 104, and is no longer sorted when retrieved by the memory controller 106. If read retry error correction of Rd3 is performed, voltage offset values of Rd3 may be arranged in order of magnitude, and another mapping relationship is created with reference to the mapping relationship between the expected voltage offset value of Rd7 and the first difference. One or more voltage offset values of Rd3 may be acquired from the read retry table according to a difference and the created mapping relationship, and may be applied to the read retry operation.

In some examples, the at least one first voltage offset value comprises one or more first voltage offset values equal to the first expected voltage offset value.

In an example, referring to the first mapping relationship shown in FIG. 15, if the test read voltage RL7 at this time is equal to the default read voltage corresponding to the state L7, during the single level read operation on the memory cell, the first expected offset value is calculated to be −250 (mV) based on the first difference between the first count and the first expected count and the first mapping relationship. Based on the first expected offset value, the first voltage offset value corresponding to Rd7 is acquired from the read retry table shown in FIG. 16. −250 is recorded in the read retry table, and one first voltage offset value −250 may be selected directly to calculate the read retry voltage, or a plurality of first voltage offset values comprising −250 may be acquired, each for summing with the default read voltage respectively, to obtain a plurality of read retry voltage. For example, 1-7 or more first voltage offset values comprising −250 are obtained. In some examples, when the first expected offset value (e.g., −248.5) calculated in conjunction with the first mapping relationship may not be recorded in the read retry table, a plurality of first expected offset values may also be acquired based on −250.

In some examples, in acquiring the plurality of first voltage offset values, a first voltage offset value equal to or close to the first expected voltage offset value may be positioned in the read retry table based on the calculated first expected voltage offset value. For example, when the first expected voltage offset value −250 or −248.5 is positioned to a new index 6, −250 in the read retry table, a plurality of indexes (e.g., 3 indexes) before and after the positioned index are acquired, e.g., acquiring indexes 3 to 9 or acquiring more indexes before and after the positioned index.

Figure 17:
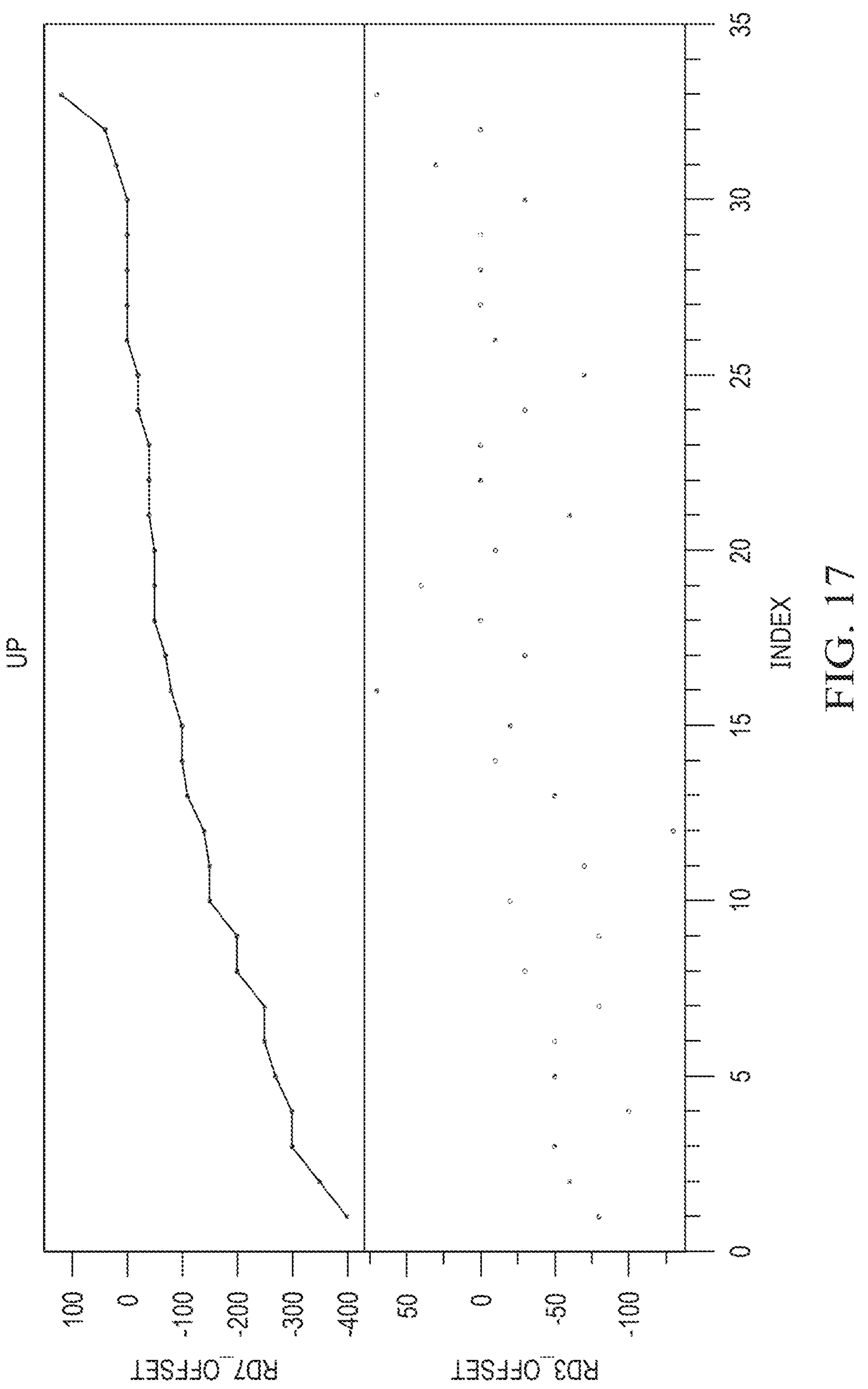
FIG. 17 is a schematic diagram illustrating an example read retry table correspondence according to examples of the present disclosure.

In some examples, referring to FIG. 17, after the offset voltage values of Rd7 in the read retry table of FIG. 16 are sorted according to the magnitudes thereof, a new index is provided and a mapping relationship between the new index and the voltage offset value Rd7_offset is generated. A desired target index can be calculated or acquired according to the first expected voltage offset value calculated in FIG. 15 in conjunction with the mapping relationship between the voltage offset value Rd_offset and the index in FIG. 17, and a query of the read retry table shown in FIG. 16 is performed according to the target index. The mapping relationship between the voltage offset value and the index can be fitted linearly to facilitate calculation or query. After calculating the first expected voltage offset value, the memory controller 106 may directly query the read retry table in FIG. 16 using the first expected voltage offset value as a reference, to acquire one or more first voltage offset values, the first voltage offset values comprising a first regional voltage offset value, or the plurality of first voltage offset values constituting an offset value range which comprises the first expected voltage offset value.

In some examples, the memory controller 106 is further configured to: generate an offset value range according to the first expected voltage offset value, wherein the first expected voltage offset value is within the offset value range; and acquire the at least one first voltage offset value located within the offset value range from the read retry table.

In some examples, the maximum value of the offset value range is the first expected voltage offset value plus a first step length, and the minimum value of the offset value range is the first expected voltage offset value minus a second step length.

Taking the first expected offset value −250 as an example, the first step length and the second step length are both set to 50, the generated offset value range is from −300 to −200, and the first voltage offset values in the read retry table within the range from −300 to −200 are acquired, comprising −300 and −200. For the case that some first voltage offset values recorded in the read retry table are equal, only one or all of the values may be acquired. When the first expected offset value is not recorded in the read retry table, a first voltage offset value closest to the first expected offset value may be found first, and then the offset value range is generated based on the closest first voltage offset value, or the offset value range is generated directly based on the first expected offset value.

In some examples, the memory controller 106 is further configured to: acquire a plurality of adjacent first voltage offset values from the read retry table.

When there are a plurality of equal voltage offset values in the plurality of first voltage offset values acquired from the read retry table, only one or all of the equal voltage offset values are acquired. The read retry table as shown in FIG. 16 records the voltage offset values corresponding to Rd3 and Rd7 corresponding to the TLC upper page (UP), wherein only the voltage offset values corresponding to Rd7 are sorted, and Rd3 may have a correspondence with Rd7. That is, after a plurality of indexes are acquired according to the voltage offset values of Rd7, the voltage offset values of Rd3 corresponding to the plurality of indexes are applied to read retry error correction of Rd3. At this time, it is required to acquire the first voltage offset values, whether equal or unequal, corresponding to the plurality of indexes for application for the read retry operation, to avoid omission of the voltage offset values of Rd3. The voltage offset values of Rd7, which is the highest level of read voltage of the UP, are sorted using the mapping relationship created based on the first count and the first expected count shown in FIG. 15, to obtain a larger statistical base and a smaller error. Sorting of the voltage offset values of Rd3 requires the mapping relationship to be created based on the second count and the second expected count, and the second count is greater than the first count at this time.

In some examples, the memory cells are multi-bit memory cells, and the plurality of data states are distinguished from each other by multi-level read voltages, and the read retry table is configured to store second voltage offset values corresponding to at least one level of read voltage, wherein the second voltage offset values corresponding to the highest level of read voltage are stored in order of magnitude, and the at least one first voltage offset value is included in the second voltage offset values corresponding to the highest level of read voltage. Here, the second voltage offset values are voltage offset values recorded in the read retry table, and the first voltage offset value is a voltage offset value recorded in the read retry table and acquired for application for the read retry operation. Taking the read retry table of FIG. 16 as an example, which records some of the voltage offset values corresponding to Rd3 and Rd7 of the UP of the TLC, with more voltage offset values of indexes not shown, the voltage offset values recorded in the read retry table are labeled as the second voltage offset values, such as −50 and −100 corresponding to Rd3, and −300 and −270 corresponding to Rd7, etc. The voltage offset values corresponding to the highest level of read voltage are arranged in order of magnitude. One or more voltage offset values acquired from the read retry table according to the first difference and the first mapping relationship and applied for the read retry operation are labeled as the first voltage offset values, such as −270, −250, and −250 corresponding to Rd7, or the like.

In some examples, referring to FIG. 8, voltage offset values of all the read retry voltages Rd1-Rd7 may be recorded in one read retry table, the voltage offset values may be correlated with each other, and the voltage offset values of the highest level may be arranged in order of voltage magnitude. The single level read operation is performed using the test read voltage RL7 corresponding to Rd7, the first count and the first difference are determined, a plurality of indexes of the read retry table are acquired in conjunction with the first mapping relationship, and voltage offset values other than those of Rd7 that are corresponding to the plurality of indexes are directly applied for the read retry operation. In some other examples, the voltage offset values corresponding to all the data states in the read retry table may have no correspondence therebetween, and the voltage offset value of each data state may be acquired respectively during the access to the read retry table for acquiring the voltage offset value. As shown in FIG. 8, for read retry error correction of the read voltage Rd7, the voltage offset value of RR-1 of Rd7 is acquired for summing with the corresponding default read voltage to obtain the read retry voltage. For read retry error correction of Rd1, the voltage offset value of RR-2 or RR-3 may be acquired, which does not necessarily correspond to that of RR-1. Even in the case that Rd3 belongs to the same UP as Rd7 in FIG. 16, acquiring the voltage offset value of RR-27 of Rd7 may not necessarily mean that the voltage offset value of RR-27 of Rd3 is acquired.

In some examples, the multi-level read voltages are divided into a plurality of groups, the read retry table comprises a plurality of read retry sub-tables, wherein one of the read retry sub-tables is configured to store the second voltage offset values corresponding to at least one level of read voltage in one of the groups, the second voltage offset values corresponding to the highest level of read voltage are stored in the read retry sub-table in order of magnitude, and the at least one first voltage offset value is included in the second voltage offset values corresponding to the highest level of read voltage in the read retry sub-table.

Taking the read voltages Rd1-Rd7 of the TLC as an example, the read voltages correspond to three pages or three groups. The upper page UP may correspond to two levels of read voltages, Rd3 and Rd7; the middle page MP may correspond to three levels of read voltages, Rd2, Rd4, and Rd6; and the lower page LP may correspond to two levels of read voltages, Rd1 and Rd5. L0-L7 are encoded using a three-bit Gray code and may be encoded into 111, 110, 100, 000, 101, 011, 001, and 101 respectively. One read retry sub-table is configured to store voltage offset values for read voltages of one page, so as to facilitate a quick access to the read retry table. In the voltage offset values of the upper page UP illustrated in FIG. 16, the voltage offset values of the highest level of read voltage Rd7 of the page are arranged in order of voltage magnitude, whereas the voltage offset values of the lower level of read voltage Rd3 may not be arranged in order of magnitude. For example, Rd3_offset in FIG. 17 does not increase strictly in accordance with the increase of the index. A read retry sub-table of the middle page MP is recorded, wherein the voltage offset values of the highest level of read voltage Rd6 are arranged in order of magnitude.

In some examples, in the read retry table that records the voltage offset values of all the read retry voltages, or in the read retry sub-table that records the voltage offset values of only one page, only the voltage offset values of the highest level of read retry voltage in the table may be arranged in order of magnitude, while other voltage offset values under the indexes of the acquired offset values of the highest level of read voltage may be used as the voltage offset values of other lower levels of read voltages. In an example, the voltage offset values of Rd7 in FIG. 16 under indexes 5, 6, and 7 are acquired, and the voltage offset values −50, −50, and −80 of Rd3 under the indexes 5, 6, and 7 are also employed. As such, it is not necessary to re-access the read retry table, make re-arrangement for Rd3, and re-create a mapping relationship between the expected voltage offset value and the corresponding difference.

Figure 18:
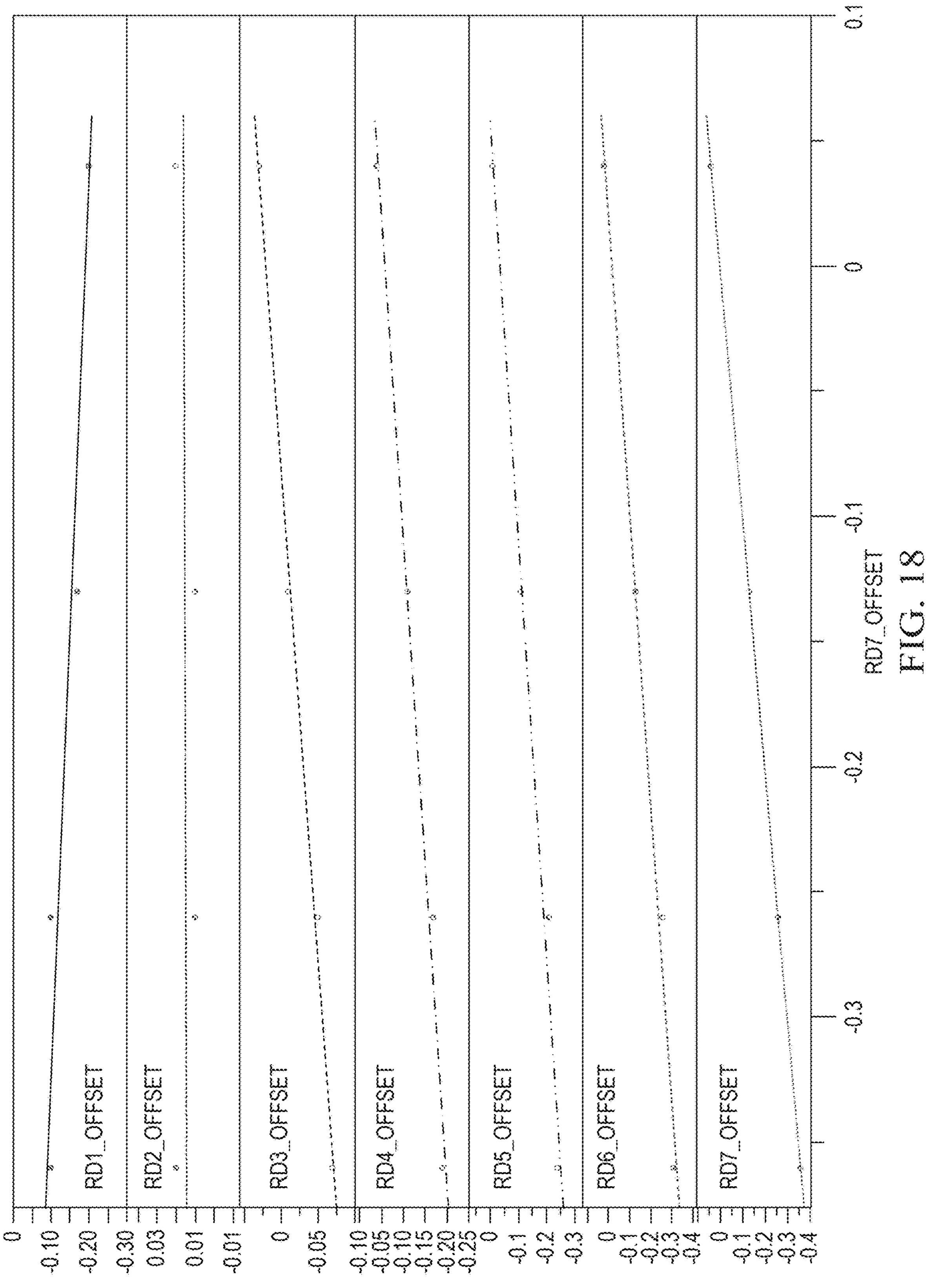
FIG. 18 is a schematic diagram illustrating voltage offset value correspondences of a plurality of data states according to examples of the present disclosure.

In some other examples, the voltage offset values of all levels of read voltages have a correlation with each other, and if a voltage offset value of a certain level of read voltage is known, an offset value of another read voltage may be acquired according to the correlation. Referring to FIG. 18, taking the read voltages Rd1-Rd7 of the TLC memory cell as an example, and using the voltage offset value Rd7_offset of the highest level of read voltage as a reference, Rd1_offset, Rd2_offset, Rd3_offset, Rd4_offset, Rd5_offset, and Rd6_offset may each have a linear relationship or a fitted linear relationship with Rd7_offset respectively, and may be calculated based on Rd7_offset respectively. The voltage offset values of the highest level of read voltage in the read retry table are sorted in order of magnitude, and the first mapping relationship between the offset value (best_offset) of the highest level of read voltage and the first difference (Diff) as shown in FIG. 15 is created, wherein the first difference is the first difference between the first count and the first expected count, the first count is a count of memory cells each having a threshold voltage less than or equal to the test read voltage corresponding to the highest level of read voltage, and the first expected count is a calibrated count to be achieved during the programming of the highest data state. The single level read operation on the memory cell is performed using the test read voltage corresponding to the highest level of read retry voltage. The first count of the current read operation is acquired and the current first difference is calculated, and the expected voltage offset value corresponding to the current test read voltage is acquired or calculated according to the first mapping relationship. The calculated expected voltage offset value and the voltage difference between the test read voltage and the default read voltage are summed to obtain the first expected voltage offset value. Using the first expected voltage offset value as a reference, at least one first voltage offset value is acquired from the read retry table, and the first voltage offset value and the default read voltage are summed to obtain the read retry voltage. The expected voltage offset values (best_offset) of the other lower levels of read voltages may be calculated according to the linear relationship in FIG. 18, and the first mapping relationship as shown in FIG. 15 may be created only once. Moreover, only the voltage offset values of the highest level of read voltage in the read retry table are sorted in order of magnitude, thereby increasing the execution rate of the read retry.

In some examples, the memory controller 106 is configured to: sum the default read voltage and each of the first voltage offset values to obtain the corresponding read retry voltage. The default read voltage is a reference voltage for summing with the voltage offset value of each data state in the read retry table, and the default read voltages of different data states may be different. When the test read voltage has a voltage difference from the default read voltage, it is required to sum the voltage difference and the expected voltage offset value obtained according to FIG. 15, to obtain the first expected voltage offset value, and then sum the first voltage offset value acquired from the read retry table according to the first expected voltage offset value and the default read voltage to obtain the read retry voltage.

Figure 19:
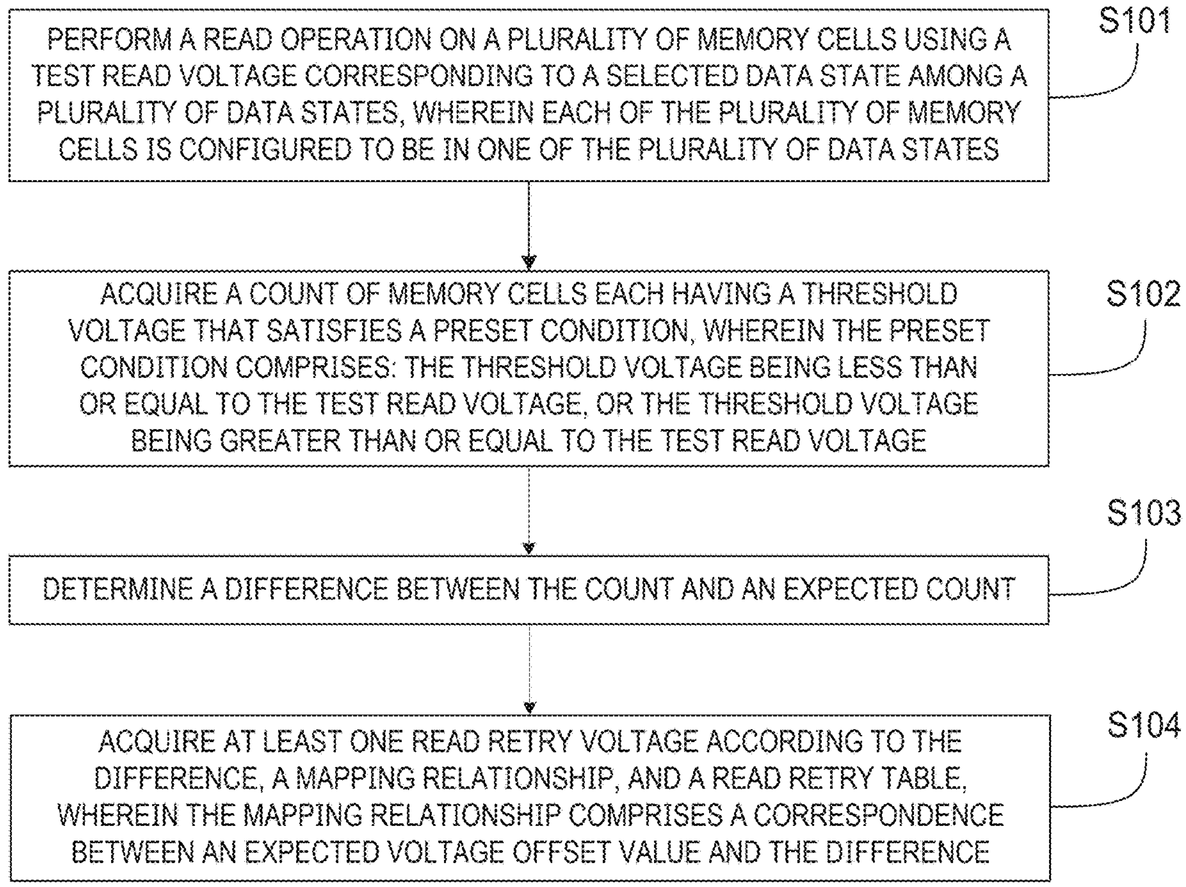
FIG. 19 is a schematic flow diagram of a control method of a memory system according to examples of the present disclosure.

According to some aspects of examples of the present disclosure, FIG. 19 provides control method of the memory system 102, comprising: performing a read operation on a plurality of memory cells using a test read voltage corresponding to a selected data state among a plurality of data states, wherein each of the plurality of memory cells is configured to be in one of the plurality of data states; acquiring a count of memory cells each having a threshold voltage that satisfies a preset condition, wherein the preset condition comprises: the threshold voltage being less than or equal to the test read voltage, or the threshold voltage being greater than or equal to the test read voltage; determining a difference between the count and an expected count; and acquiring at least one read retry voltage according to the difference, a mapping relationship, and a read retry table, wherein the mapping relationship comprises a correspondence between an expected voltage offset value and the difference.

In the examples of the present disclosure, the single level read mode is enabled, and the memory controller 106 performs, in response to the operation instruction, a single level read operation on a memory cell on the respective address using the test read voltage. The single level read mode comprises reading at least one bit of data stored in the memory cell through one level of read voltage, wherein the memory cell is configured as an SLC and read using a test read voltage RL, and statistics of bit information read from the memory cell is collected. The memory cell having a threshold voltage less than or equal to the test read voltage is read as 1, and the memory cell having a threshold voltage greater than the test read voltage is read as 0, without applying multi-level test read voltages prior to collecting statistics of the bit information.

In some examples, the count comprises a first count of memory cells each having a threshold voltage less than or equal to the test read voltage among the plurality of memory cells, the expected count comprises a first expected count, which is a preset count of memory cells each having a threshold voltage less than or equal to a default read voltage among the plurality of memory cells, the mapping relationship comprises a first mapping relationship, which is acquired based on the first expected count, and the control method further comprises:

- acquiring a first expected voltage offset value according to a first difference between the first count and the first expected count, the first mapping relationship, and a voltage difference between the test read voltage and the default read voltage; and
- acquiring at least one first voltage offset value from the read retry table according to the first expected voltage offset value.

In some examples, the at least one first voltage offset value is stored in the read retry table in order of magnitude.

In some examples, the at least one first voltage offset value comprises one or more first voltage offset values equal to the first expected voltage offset value.

In some examples, the control method further comprises: generating an offset value range according to the first expected voltage offset value, wherein the first expected voltage offset value is within the offset value range; and acquiring the at least one first voltage offset value located within the offset value range from the read retry table.

In some examples, the maximum value of the offset value range is the first expected voltage offset value plus a first step length, and the minimum value of the offset value range is the first expected voltage offset value minus a second step length.

In some examples, the control method further comprises: acquiring a plurality of adjacent first voltage offset values from the read retry table.

In some examples, the memory cells are multi-bit memory cells, and the plurality of data states are distinguished from each other by multi-level read voltages, and the read retry table is configured to store second voltage offset values corresponding to at least one level of read voltage, wherein the second voltage offset values corresponding to the highest level of read voltage are stored in order of magnitude, and the at least one first voltage offset value is included in the second voltage offset values corresponding to the highest level of read voltage.

In some examples, the multi-level read voltages are divided into a plurality of groups, the read retry table comprises a plurality of read retry sub-tables, wherein one of the read retry sub-tables is configured to store the second voltage offset values corresponding to at least one level of read voltage in one of the groups, the second voltage offset values corresponding to the highest level of read voltage are stored in the read retry sub-table in order of magnitude, and the at least one first voltage offset value is included in the second voltage offset values corresponding to the highest level of read voltage in the read retry sub-table.

In some examples, the first count of memory cells each having a threshold voltage less than the test read voltage among the plurality of memory cells is greater than a second count of memory cells each having a threshold voltage greater than the test read voltage among the plurality of memory cells.

In some examples, the control method further comprises: summing the default read voltage and each of the first voltage offset values to obtain the corresponding read retry voltage.

According to some aspects of examples of the present disclosure, there is provided a readable storage medium storing a computer program which, when executed, implements the control method.

The memory device 104 may comprise a NAND memory, the memory cell of the NAND memory may either comprise a floating gate memory cell that includes a floating gate transistor, or a charge trapping memory cell that includes a charge trapping transistor.

The storage medium may be memories such as Ferromagnetic Random Access Memory (FRAM), Magnetic Random Access Memory (MRAM), Read Only Memory (ROM), or Programmable Read-Only Memory (PROM), Erasable Programmable Read-Only Memory (EPROM), Electrically Erasable Programmable Read-Only Memory (EEPROM), Flash Memory, magnetic surface memory, optical disc, or Compact Disc Read-Only Memory (CD-ROM); alternatively, it may be various devices including one of the above memory devices 104 or any combination thereof.

In some examples, executable instructions may in the form of a program, software, software module, script, or code, written in any form of programming language, including compiled or interpreted languages, or declarative or procedural languages, and may be deployed in any form, including deployed as a stand-alone program or deployed as a module, component, subroutine, or other means suitable for use in a computing environment.

As an example, executable instructions may, but do not necessarily correspond to, files in a file system and may be stored as part of a file holding other programs or data, for example, stored in one or more scripts in a Hyper Text Markup Language (HTML) document, stored in a single file that is specific to the program in question, or, stored in multiple collaborative files (for example, files that store one or more modules, subroutines, or portions of code).

As an example, the executable instruction may be deployed on an electronic apparatus for execution, or on a plurality of electronic apparatuses at one site for execution, or distributed on a plurality of electronic apparatuses interconnected through a communication network at a plurality of sites for execution.

The above descriptions are merely examples of the present disclosure, and the protection scope of the present disclosure is not limited to these. Any variation or replacement that may be readily figured out by those skilled in the art within the technical scope disclosed by the present disclosure shall fall within the protection scope of the present disclosure.

What is claimed is:

1. A memory system, comprising:

a memory device comprising a plurality of memory cells, wherein each of the plurality of memory cells is configured to be in one of a plurality of data states; and a memory controller coupled with the memory device and configured to:

perform a read operation using a test read voltage corresponding to a selected data state among the plurality of data states;

acquire a count of memory cells each having a threshold voltage that satisfies a preset condition, wherein the preset condition comprises: the threshold voltage being less than or equal to the test read voltage, or the threshold voltage being greater than or equal to the test read voltage;

determine a difference between the count and an expected count; and acquire at least one read retry voltage according to the difference, a mapping relationship, and a read retry table, wherein the mapping relationship comprises a correspondence between an expected voltage offset value and the difference.

2. The memory system of claim 1, wherein the count comprises a first count of memory cells each having a threshold voltage less than or equal to the test read voltage among the plurality of memory cells, the expected count comprises a first expected count, which is a preset count of memory cells each having a threshold voltage less than or equal to a default read voltage among the plurality of memory cells, the mapping relationship comprises a first mapping relationship, which is acquired based on the first expected count, and the memory controller is further configured to:

acquire a first expected voltage offset value according to a first difference between the first count and the first expected count, the first mapping relationship, and a voltage difference between the test read voltage and the default read voltage; and acquire at least one first voltage offset value from the read retry table according to the first expected voltage offset value.

3. The memory system of claim 2, wherein the at least one first voltage offset value is stored in the read retry table in order of magnitude.

4. The memory system of claim 3, wherein the at least one first voltage offset value comprises one or more first voltage offset values equal to the first expected voltage offset value.

5. The memory system of claim 3, wherein the memory controller is further configured to:

generate an offset value range according to the first expected voltage offset value, wherein the first expected voltage offset value is within the offset value range; and acquire the at least one first voltage offset value located within the offset value range from the read retry table.

6. The memory system of claim 5, wherein a maximum value of the offset value range is the first expected voltage offset value plus a first step length, and a minimum value of the offset value range is the first expected voltage offset value minus a second step length.

7. The memory system of claim 5, wherein the memory controller is further configured to:

acquire a plurality of adjacent first voltage offset values from the read retry table.

8. The memory system of claim 3, wherein the memory cells are multi-bit memory cells, and the plurality of data states are distinguished from each other by multi-level read voltages, and the read retry table is configured to store second voltage offset values corresponding to at least one level of read voltage, wherein the second voltage offset values corresponding to a highest level of read voltage are stored in order of magnitude, and the at least one first voltage offset value is included in the second voltage offset values corresponding to the highest level of read voltage.

9. The memory system of claim 8, wherein the multi-level read voltages are divided into a plurality of groups, the read retry table comprises a plurality of read retry sub-tables, wherein one of the read retry sub-tables is configured to store the second voltage offset values corresponding to at least one level of read voltage in one of the groups, the second voltage offset values corresponding to the highest level of read voltage are stored in the read retry sub-table in order of magnitude, and the at least one first voltage offset value is included in the second voltage offset values corresponding to the highest level of read voltage in the read retry sub-table.

10. The memory system of claim 2, wherein the first count of memory cells each having a threshold voltage less than the test read voltage among the plurality of memory cells is greater than a second count of memory cells each having a threshold voltage greater than the test read voltage among the plurality of memory cells.

11. The memory system of claim 2, wherein the memory controller is configured to:

sum the default read voltage and the at least one first voltage offset value to obtain the corresponding read retry voltage.

12. A control method of a memory system, comprising:

performing a read operation on a plurality of memory cells using a test read voltage corresponding to a selected data state among a plurality of data states, wherein each of the plurality of memory cells is configured to be in one of the plurality of data states;

acquiring a count of memory cells each having a threshold voltage that satisfies a preset condition, wherein the preset condition comprises: the threshold voltage being less than or equal to the test read voltage, or the threshold voltage being greater than or equal to the test read voltage;

determining a difference between the count and an expected count; and acquiring at least one read retry voltage according to the difference, a mapping relationship, and a read retry table, wherein the mapping relationship comprises a correspondence between an expected voltage offset value and the difference.

13. The control method of claim 12, wherein the count comprises a first count of memory cells each having a threshold voltage less than or equal to the test read voltage among the plurality of memory cells, the expected count comprises a first expected count, which is a preset count of memory cells each having a threshold voltage less than or equal to a default read voltage among the plurality of memory cells, the mapping relationship comprises a first mapping relationship, which is acquired based on the first expected count, and the control method further comprises:

acquiring a first expected voltage offset value according to a first difference between the first count and the first expected count, the first mapping relationship, and a voltage difference between the test read voltage and the default read voltage; and acquiring at least one first voltage offset value from the read retry table according to the first expected voltage offset value.

14. The control method of claim 13, wherein the at least one first voltage offset value is stored in the read retry table in order of magnitude.

15. The control method of claim 14, wherein the at least one first voltage offset value comprises one or more first voltage offset values equal to the first expected voltage offset value.

16. The control method of claim 14, further comprising:

generating an offset value range according to the first expected voltage offset value, wherein the first expected voltage offset value is within the offset value range; and acquiring the at least one first voltage offset value located within the offset value range from the read retry table.

17. The control method of claim 16, wherein a maximum value of the offset value range is the first expected voltage offset value plus a first step length, and a minimum value of the offset value range is the first expected voltage offset value minus a second step length.

18. The control method of claim 16, further comprising:

acquiring a plurality of adjacent first voltage offset values from the read retry table.

19. The control method of claim 14, wherein the memory cells are multi-bit memory cells, and the plurality of data states are distinguished from each other by multi-level read voltages, and the read retry table is configured to store second voltage offset values corresponding to at least one level of read voltage, wherein the second voltage offset values corresponding to a highest level of read voltage are stored in order of magnitude, and the at least one first voltage offset value is included in the second voltage offset values corresponding to the highest level of read voltage.

20. A readable storage medium, storing a computer program which, when executed, implements a control method of a memory system, wherein the control method comprises:

performing a read operation on a plurality of memory cells using a test read voltage corresponding to a selected data state among a plurality of data states, wherein each of the plurality of memory cells is configured to be in one of the plurality of data states;

acquiring a count of memory cells each having a threshold voltage that satisfies a preset condition, wherein the preset condition comprises: the threshold voltage being less than or equal to the test read voltage, or the threshold voltage being greater than or equal to the test read voltage;

determining a difference between the count and an expected count; and acquiring at least one read retry voltage according to the difference, a mapping relationship, and a read retry table, wherein the mapping relationship comprises a correspondence between an expected voltage offset value and the difference.

* * * * *